(12) United States Patent
Narendra et al.

(10) Patent No.: US 7,541,782 B2
(45) Date of Patent: Jun. 2, 2009

(54) SYSTEM AND METHOD FOR EXTRACTING ENERGY FROM AN ULTRACAPACITOR

(75) Inventors: Siva G. Narendra, Portland, OR (US); Shekhar Y. Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 530 days.

(21) Appl. No.: 10/811,806

(22) Filed: Mar. 30, 2004

(65) Prior Publication Data

US 2005/0219784 A1 Oct. 6, 2005

(51) Int. Cl.
*H02J 7/00* (2006.01)
*H02J 7/06* (2006.01)
*H02J 7/24* (2006.01)

(52) U.S. Cl. .................. 320/167; 320/166; 320/162; 320/164

(58) Field of Classification Search .......... 320/166, 320/167, 164, 162
See application file for complete search history.

(56) References Cited

U.S. PATENT DOCUMENTS

| | | | |
|---|---|---|---|
| 5,517,379 A * | 5/1996 | Williams et al. ............ 361/84 |
| 6,268,666 B1 * | 7/2001 | Bhowmik ................ 307/72 |
| 6,476,587 B2 * | 11/2002 | Sasaki ..................... 320/166 |
| 2001/0054881 A1 * | 12/2001 | Watanabe ................ 320/166 |
| 2002/0070712 A1 * | 6/2002 | Arul ....................... 320/167 |
| 2003/0062876 A1 * | 4/2003 | Desprez et al. ........... 320/167 |
| 2004/0036449 A1 * | 2/2004 | Bean et al. ............... 320/166 |
| 2005/0047039 A1 * | 3/2005 | Rajashekara et al. ....... 361/62 |

OTHER PUBLICATIONS http://www.maxwell.com/ultracapacitors/index.html.
David Linden (editor), Thomas B. Reddy (editor), *Handbook of Batteries*, McGraw-Hill Professional, 3rd Edition, Chapters 42 and 43, Aug. 30, 2001.

* cited by examiner

*Primary Examiner*—Edward Tso
*Assistant Examiner*—Alexis Boateng
(74) *Attorney, Agent, or Firm*—Ked & Associates LLP

(57) ABSTRACT

An extraction system detects a voltage stored in a capacitor and then extracts energy from the capacitor when the voltage falls below a predetermined value. The capacitor may be an ultracapacitor formed in silicon or another semiconductor material, and the predetermined value may equal or be based on a minimum operating voltage of a load driven by the ultracapacitor. Once the energy is extracted, the system converts the energy into a voltage sufficient to continue driving the load. Energy extraction may be performed by a variety of circuits including a linear regulator, a switched capacitor voltage converter, an adiabatic amplifier, and a DC-to-DC boost converter. The system may further include a monitoring circuit which detects dynamic changes in the converted ultracapacitor voltage over to maintain the operating voltage of the load.

23 Claims, 26 Drawing Sheets

$$Q_{TOTAL} = Q_1 + Q_2 + Q_3 + Q_4 + Q_5 + Q_6 + Q_7 + Q_8 + Q_9 + Q_{10} + Q_{11}$$

ELECTRODE (TERMINAL 1) - EXAMPLE: POROUS CARBON OR DOPED SILICON. CAN BE CONDUCTIVE CARBON OR SILICON NANOTUBE
ELECTROLYTE (TERMINAL X) - EXAMPLE: POTASSIUM HYDROXIDE
ELECTRODE (TERMINAL 2) - EXAMPLE: POROUS CARBON OR DOPED SILICON. CAN BE CONDUCTIVE CARBON OR SILICON NANOTUBE

T1 - DURATION FOR WHICH THE CAPACITOR ENERGY CAN BE USED BY LOAD WITHOUT EEC
T2 - DURATION FOR WHICH THE CAPACITOR ENERGY CAN BE USED BY THE LOAD WITH EEC

SYSTEM AND METHOD FOR EXTRACTING ENERGY FROM AN ULTRACAPACITOR

FIELD

This invention relates to energy storage devices, and more particularly to capacitive structures formed in integrated circuits and methods for extracting energy from the same.

BACKGROUND OF THE INVENTION

A battery is a device that stores electric charge for use as a power source. The charging process is based on a chemical reaction that takes place between an electrolyte and two electrodes called an anode and cathode. The capacity to store electric charge is a function of the surface area of these electrodes and the particular electrolyte used.

Common types of batteries include sealed lead acid (SLA) batteries, nickel-cadmium (Ni—Cd) batteries, and lithium-ion (Li-Ion) batteries. SLA batteries can hold a charge for up to three years and are generally used to provide backup power during emergencies. Ni—Cd batteries provide a fast, even energy discharge and are most often used to power appliances and audio and video equipment. Li-Ion batteries have the highest energy storage capacity (generally twice the capacity of Ni—Cd batteries) and are used to power portable computers, cellular phones, and digital cameras to name a few.

Another type of battery known as a double-layer capacitor stores energy based on a microscopic charge separation that takes place at an electrical-chemical interface between an electrode and electrolyte. The capacitor is charged by a primary energy source and then discharged when connected to a device to be powered, generally referred to as a load. The charging and discharging process is repeatable; that is, after discharging takes place through the load the capacitor may be recharged by connecting its electrodes to the primary energy source. Double-layer capacitors have been used to power bulk electronic devices including radios, motors, and the like.

On a vastly smaller scale and more particularly in the field of large scale integration, solid-state capacitors are used to store charge. Unlike double-layer capacitors and other types of electrochemical batteries, solid-state capacitors store energy in the form of an electrostatic field between a pair of conductive layers separated by a dielectric material. In these devices, capacitance is directly proportional to the surface areas of the conductive layers and is inversely proportional to the separation distance between these layers. Capacitance also depends on the dielectric constant of the material separating the layers.

Because solid-state capacitors are only formed from two conductive layers, they are limited in terms of the amount of voltage they can store. Attempts have been made to increase the storage capacity of solid-state capacitors by increasing the surface area of the conductive layers. This approach, however, has proven to be undesirable because the increased surface area consumes an excessive amount of die space. A need therefore exists for an improved energy storage device for use in integrated circuits. There is also a need for a system and method of extending the useful range of solid-state capacitors by extracting latent or otherwise previously untappable energy stored in them.

DESCRIPTION OF THE PREFERRED EMBODIMENTS

Figure 1:
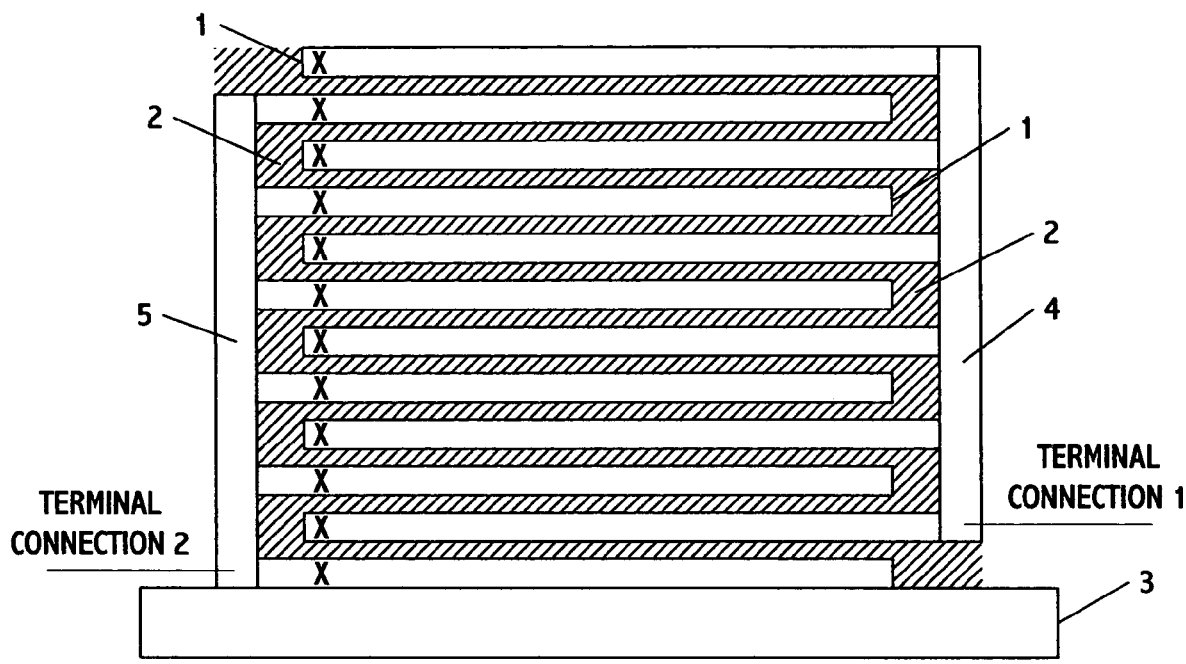
FIG. 1 is a diagram showing a cross-sectional view of an ultracapacitor according to one embodiment of the present invention.

FIG. 1 shows an ultracapacitor according to one embodiment of the present invention. The ultracapacitor includes a plurality of conductive layers 1 with intervening dielectric layers 2 formed on a semiconductor substrate 3. The substrate may be formed from or include p-type or n-type material or may be formed as a silicon-on-insulator (SOI) substrate. Preferably, the substrate is formed from a silicon die which supports the ultracapacitor in an integrated circuit chip package either alone, with other ultracapacitors, or with other circuits including, for example, those that are to be powered by or otherwise operate based on a voltage stored in the ultracapacitor. While silicon is preferable, the substrate may be used by other semiconductor materials including but not limited to gallium arsenide and germanium.

The dielectric layers are respectively formed between the conductive layers and are preferably made from a material having a high dielectric constant k. Non-limiting examples include a hafnium oxide such as hafnium dioxide ($HfO_2$) having a k=15, zirconium dioxide ($ZrO_2$) having a k=22, and Barium titanate powder ($BaTiO_3$) having a k=230. Materials with other k values may be used depending, for example, on the capacitance requirements of a specific application. The thicknesses of the dielectric layers are controlled during fabircation to achieve a predetermined voltage-storage capacity at respective portions of the ultracapacitor.

The conductive layers may be made of any conductive material including but not limited to metal or polysilicon. The number of conductive layers may be varied to satisfy the requirements of a particular application. For illustrative purposes twelve layers are shown in FIG. 1, however the ultracapacitor may be formed from a larger or smaller number of layers with three layers being a minimum. When situated in this manner, at least one of the layers will have upper and lower surfaces which are used to store charge with adjacent layers. In the embodiment shown, the odd-numbered conductive layers are interconnected by a stud line 4, which is connected to a first terminal of the ultracapacitor. The even-numbered conductive layers are interconnected by a stud line 5, which is connected to a second terminal of the ultracapacitor.

For all practical purposes, each metal layer in the ultracapacitor will have a minimum and maximum allowable width. In some applications, it may be preferable to use the minimum width in order to allow a larger number of layers to be interleaved and thus to increase the cross-capacitance per layer. In other applications, larger widths may be used, i.e, depending on the process technology and metals used the widths of all or a portion of layers 1 may be larger than a minimum allowable width in order to achieve, for example, a specific cross-capacitance, parasitic resistance, or other level of performance.

In FIG. 1, the widths of the conductive layers are shown to be equal and the same is true of the spacings between the layers. In alternative embodiments, the widths and/or spacings may vary. For example, in FIG. 8(a), an ultracapacitor having conductive layers of differing widths but equal spacings is shown. This difference in width affects parasitic resistance that appears in series with capacitance. While the widths of the conductive layers in FIG. 8(a) uniformly decrease from top to bottom, other variations include uniformly increasing conductive-layer widths or ones which do not uniformly vary at all to achieve a predetermined charge-storage distribution throughout the ultracapacitor structure. The spacings between the layers may also be uniformly or non-uniformly varied to achieve a specific level of performance. In general, the smaller the spacing the larger the capacitance and hence the greater the charge storage capacity of the ultracapacitor.

In the foregoing illustrative embodiment, the ultracapacitor is shown as having twelve interleaved metal layers. Six layers are connected to a first terminal (terminal connection 1) and the other six are connected to a second (terminal connection 2). The six layers connected to the first terminal will therefore assume the voltage applied to the first terminal, and the six layers connected to the second terminal will assume the voltage applied to the second terminal. The ultracapacitor therefore may be regarded as a parallel connection of a plurality of capacitors.

Structured in this manner, the ultracapacitor collectively stores a charge equal to the potential difference between the first and second terminals. For example, if $V_1$ is applied to the first terminal and $V_2$ is applied to the second terminal, the ultracapacitor will store a voltage equal to $V_2-V_1$ between the terminals. The capacitance for storing charge corresponding to this voltage difference depends on the number of metal layers connected between the terminals, i.e., the more metal layers (and thus capacitors) between the terminals the greater the capacitance available for storing $V_2-V_1$.

Figure 2:
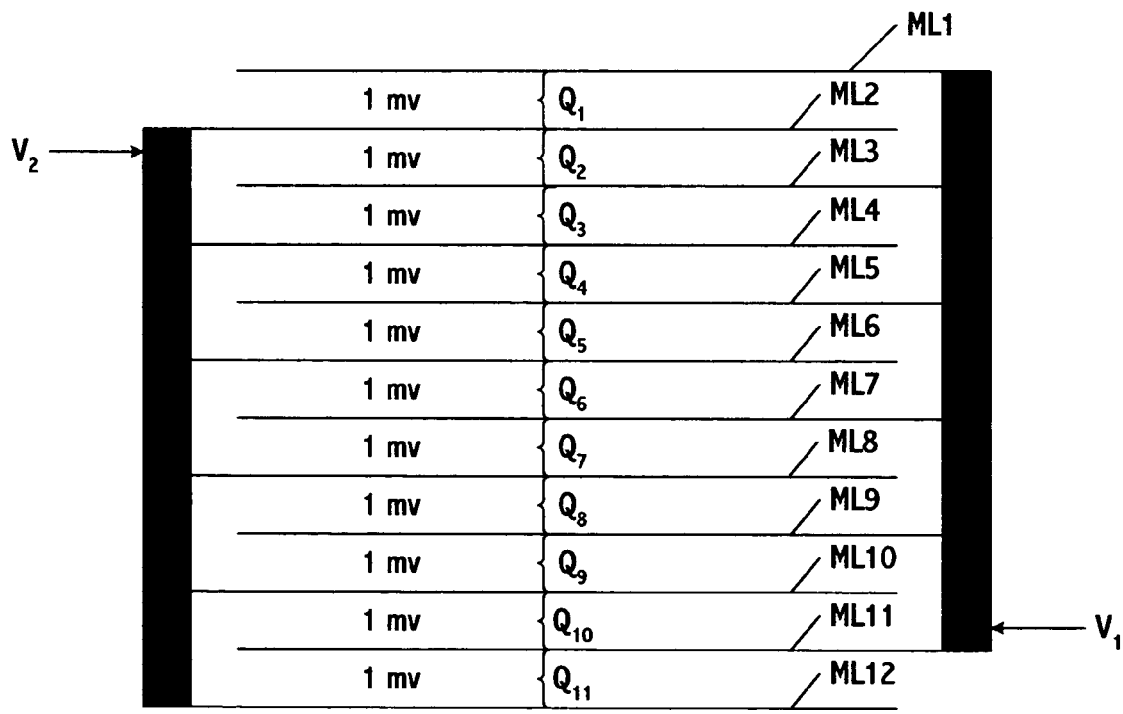
FIG. 2 is a diagram showing an example of a charge-distribution that may be supported by the ultracapacitor of FIG. 1.

FIG. 2 shows the charge storage distribution for the ultracapacitor of FIG. 1. In this figure, both upper and lower surfaces of intermediate metal layers ML2-ML11 store charge for separate capacitors, e.g., ML1 and the upper surface of ML2 form a first capacitor, the lower surface of ML2 and the upper surface of ML3 form a second capacitor, and so on. A total of eleven capacitors is therefore formed from the twelve metal layers.

The amount of charge stored between each overlapping pair of metal layers depends on factors including the spacing between the layers, widths of the layers, and the k value of the intervening dielectric. Metal layers having larger widths are expected to store more charge than layers with smaller widths, and vice versa. These widths or any of the aforementioned factors may be set to achieve a specific charge distribution for a given application. For example, if the widths or spacings between the layers are not the same, each adjacent pair of metal layers may store a different proportion of charge. Thus, both uniform and non-uniform charge distributions are possible. For illustrative purposes, the total charge $Q_{total}$ stored in the capacitor is shown as a sum of the charges $Q_1$ through $Q_{11}$.

Figure 3:
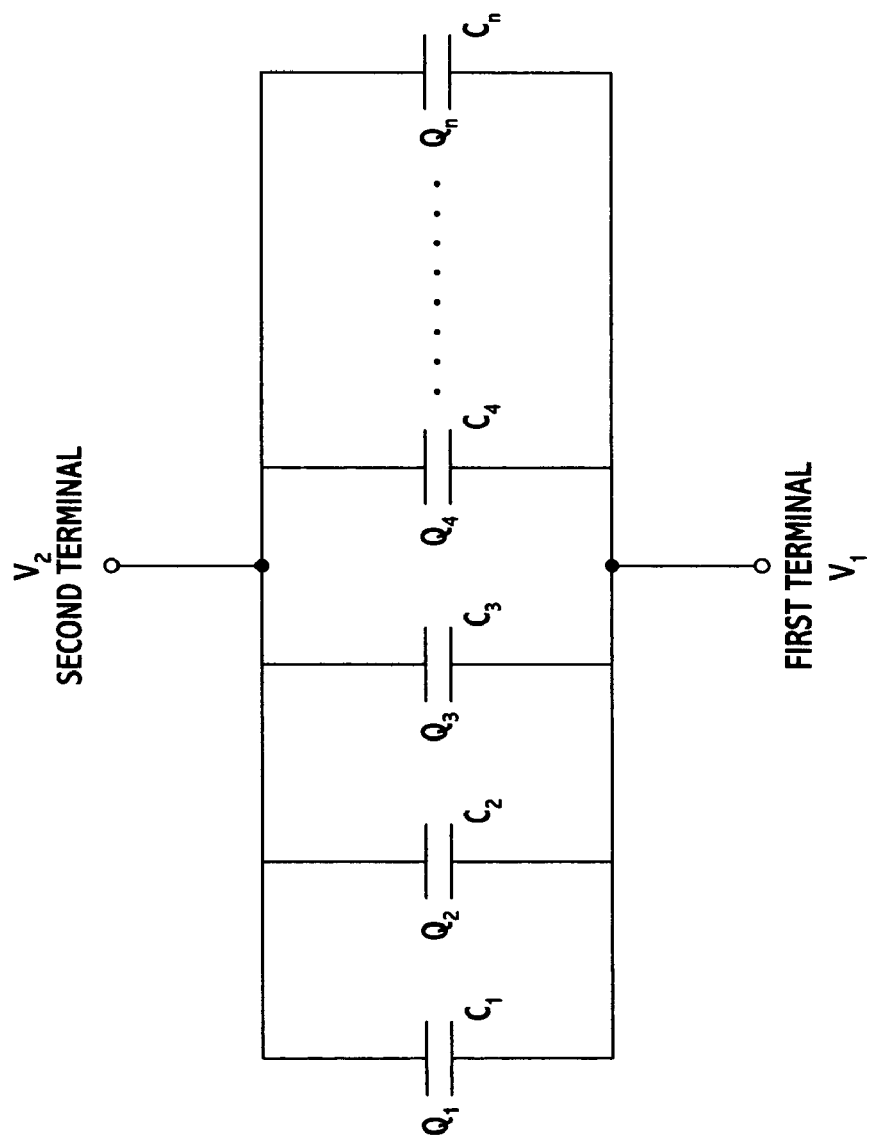
FIG. 3 is an equivalent circuit diagram of the ultracapacitor of FIG. 1.

FIG. 3 shows an equivalent circuit diagram for the ultracapacitor of FIG. 1. As previously indicated, this circuit includes capacitors $C_1$-$C_{11}$ formed from overlapping pairs of adjacent metal layers 1 connected between two terminals. The voltages applied to the terminals are respectively shown as $V_1$ and $V_2$. In this parallel arrangement, the voltage across each capacitor is the same ($\Delta V=V_2-V_1$) and the charges stored in each of capacitors $C_1$-$C_{11}$ are represented as $Q_1$-$Q_{11}$ respectively. Since Q=CV, the total capacitance of the ultracapacitor may be represented as a sum of the capacitances:

$$\begin{aligned} C_{total} &= (Q_1 + Q_2 + Q_3 + \ldots + Q_{11})/\Delta V \\ &= Q_1/\Delta V + Q_2/\Delta V + Q_3/\Delta V + \ldots Q_{11}/\Delta V \\ &= C_1 + C_2 + C_3 + \ldots + C_{11} \end{aligned}$$

From the above equations, it is evident that the overlapping pairs of adjacent metal layers included in the embodiments described herein have the effect of increasing the overall capacitance and thus the charge-storage capacity of the ultracapacitor for a given voltage. When implemented in silicon or another semiconductor material, the embodiments described herein may be used for a variety of integrated circuit applications, e.g., driving an on-chip load, powering a circuit, storing data, etc.

Figure 4:
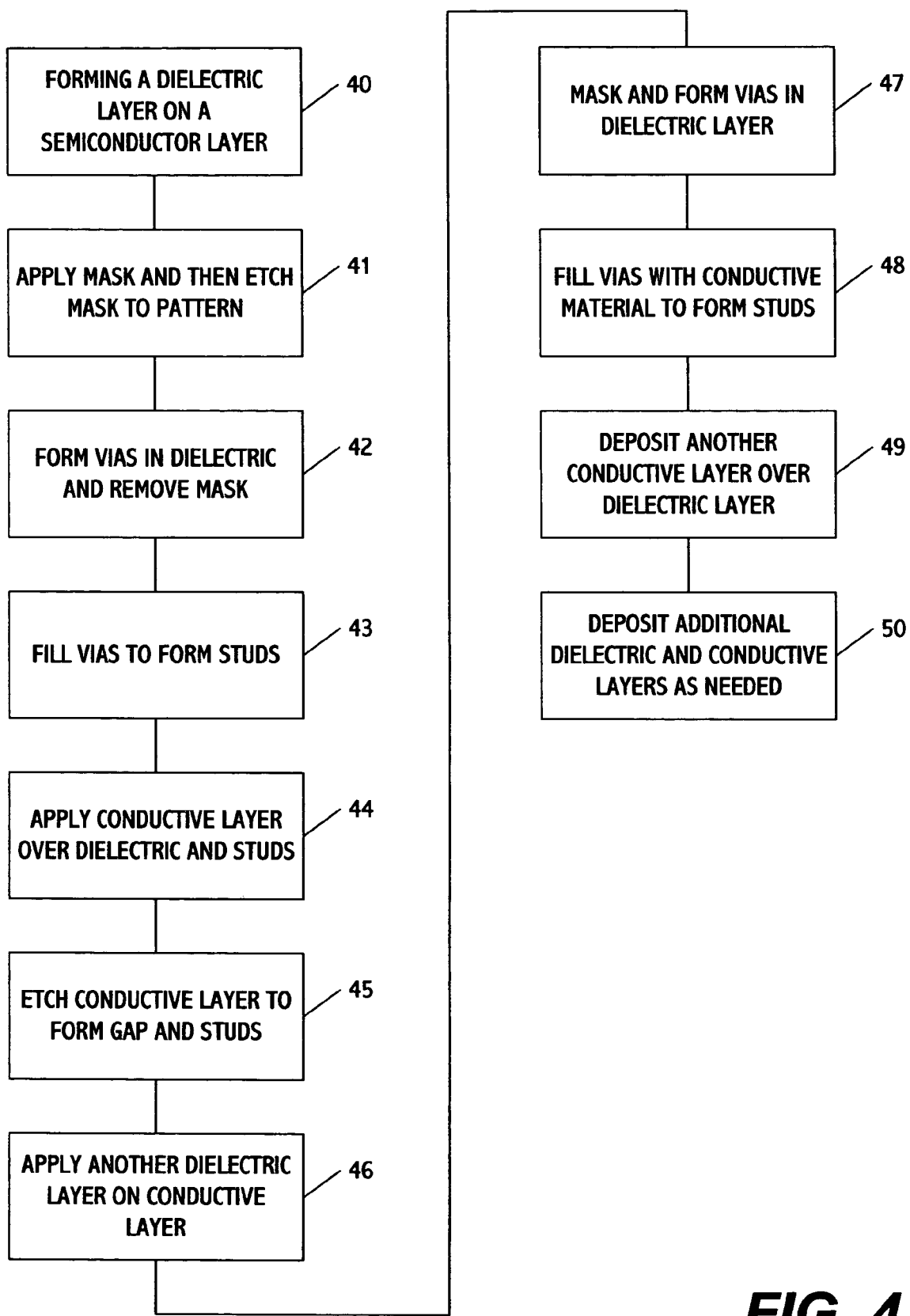
FIG. 4 is a diagram showing blocks included in a method for forming an ultracapactor in accordance with one embodiment of the present invention.

FIG. 4 shows a method for forming an ultracapacitor in accordance with an embodiment of the present invention. This method uses known semiconductor-chip fabrication techniques to achieve any of the aforementioned ultracapacitor structures. By way of illustration, FIGS. 5(a)-5(k) show the results of individual stages of the method when applied to form an ultracapacitor having conductive layers whose widths uniformly vary but which have substantially constant spacings.

An initial stage involves forming a dielectric layer 11 on the surface of a semiconductor layer 10 to a predetermined thickness. (Block 40, FIG. 5(a)). The dielectric layer may be any of those preveiously mentioned or any another type. Preferably, the dielectric material has a high k value, however this is not a necessity. Layer 10 is fromed silicon or another type of semiconductor material which, for example, may be included as part of a die of an integrated cirouit chip.

Once formed, the dielectric layer is coated with a masking layer 12 using any one of a variety of deposition techniques, e.g., chemical vapor deposition. Portions of the masking layer are then etched away using, for example, lithography and reactive ion etching to form holes 13 and 14 at locations where vias are to be formed in the ultracapacitor structure. (Block 41, FIG. 5(b)). A subsequent etching may then be performed to form the vias 15 and 16 in the dielectric layer and to remove remaining portions of the masking layer. (Block 42, FIG. 5(c)).

The vias are then filled with a conductive material to form studs 17 and 18 in the dielectric layer. This may be accomplished using known deposition techniques. The studs form portions of different terminals which are eventually connected to the conductive layers. (Block 43, FIG. 5(d)).

Figure 5A:
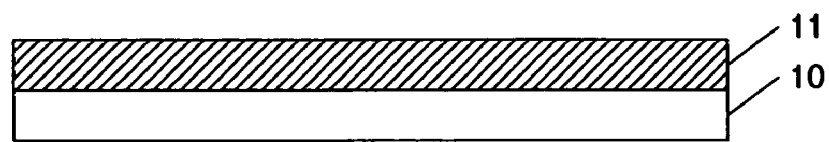
FIGS. 5(a)-5(k) are diagram showing results obtained when respective blocks of the process shown in FIG. 4 are performed.
Figure 5B:
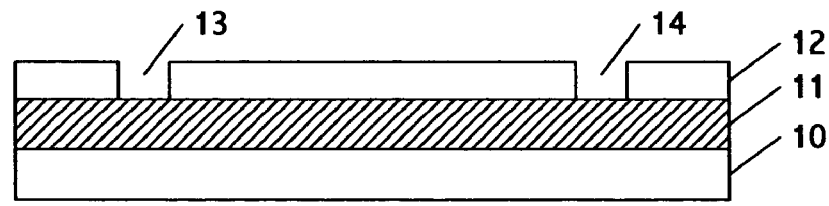
Figure 5C:
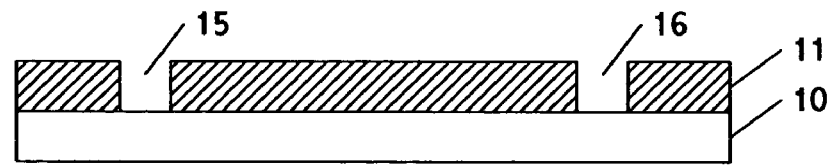
Figure 5D:
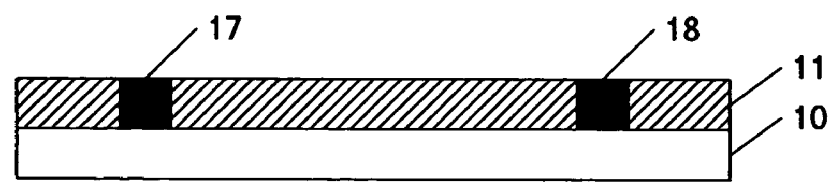
Figure 5E:
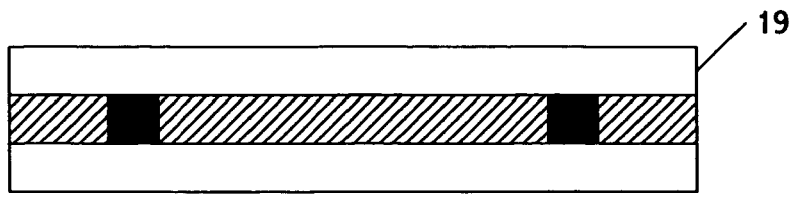
Figure 5F:
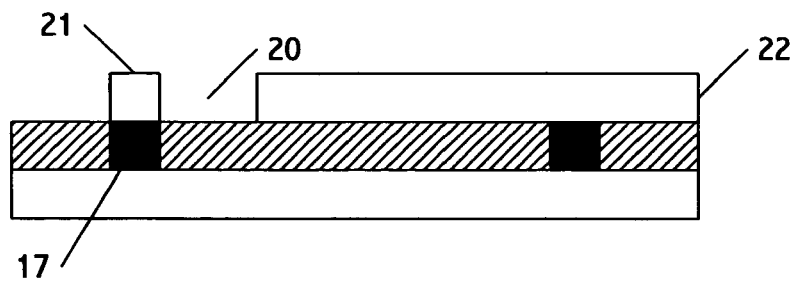
Figure 5G:
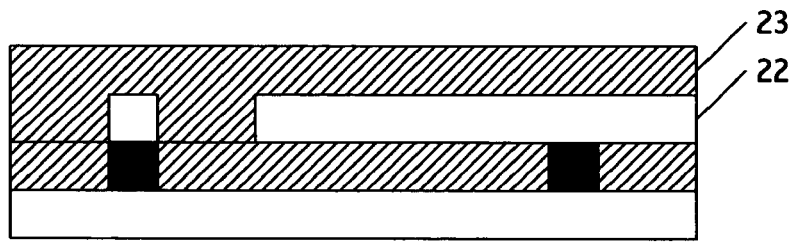
Figure 5H:
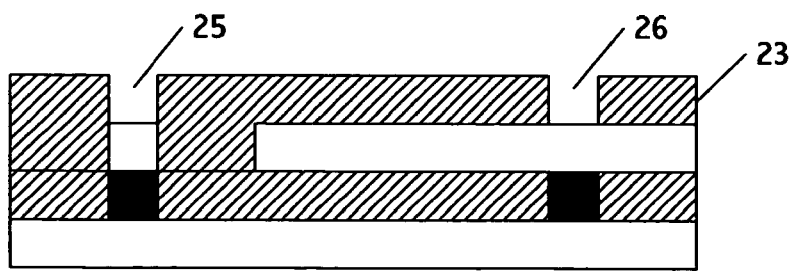
Figure 5I:
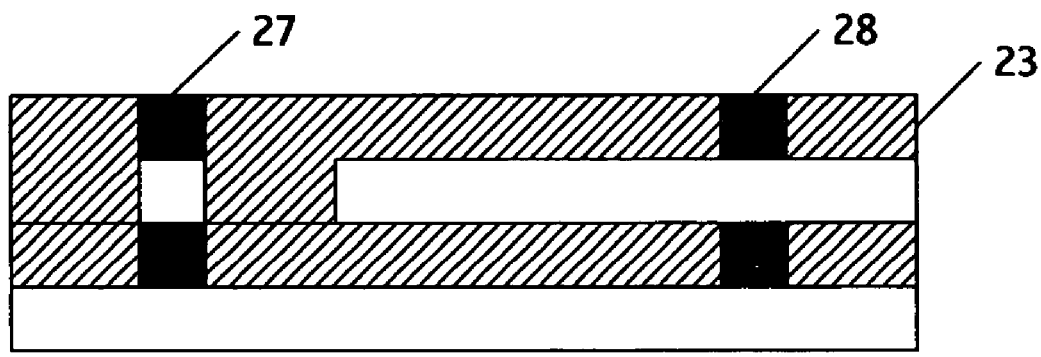
Figure 5J:
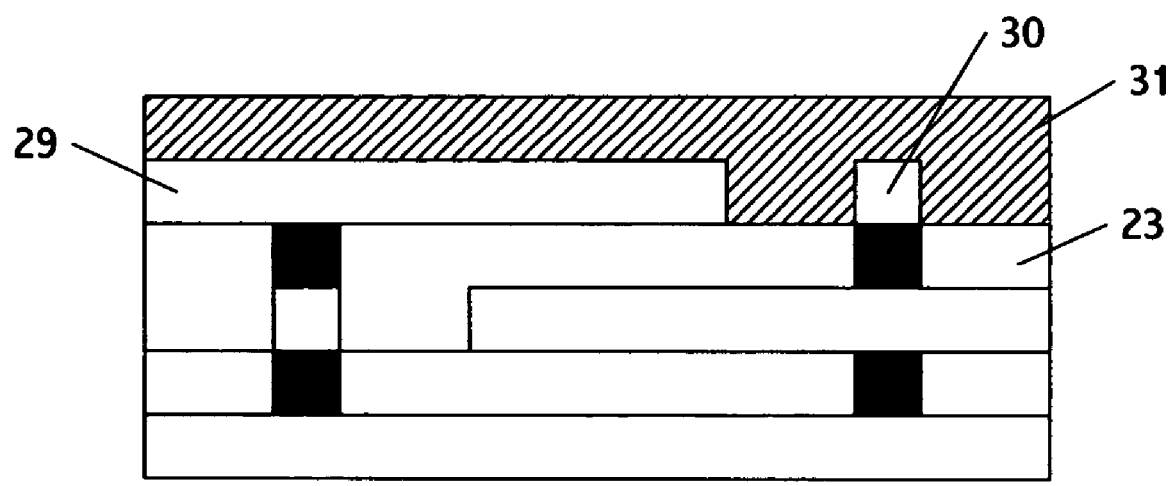
Figure 5K:
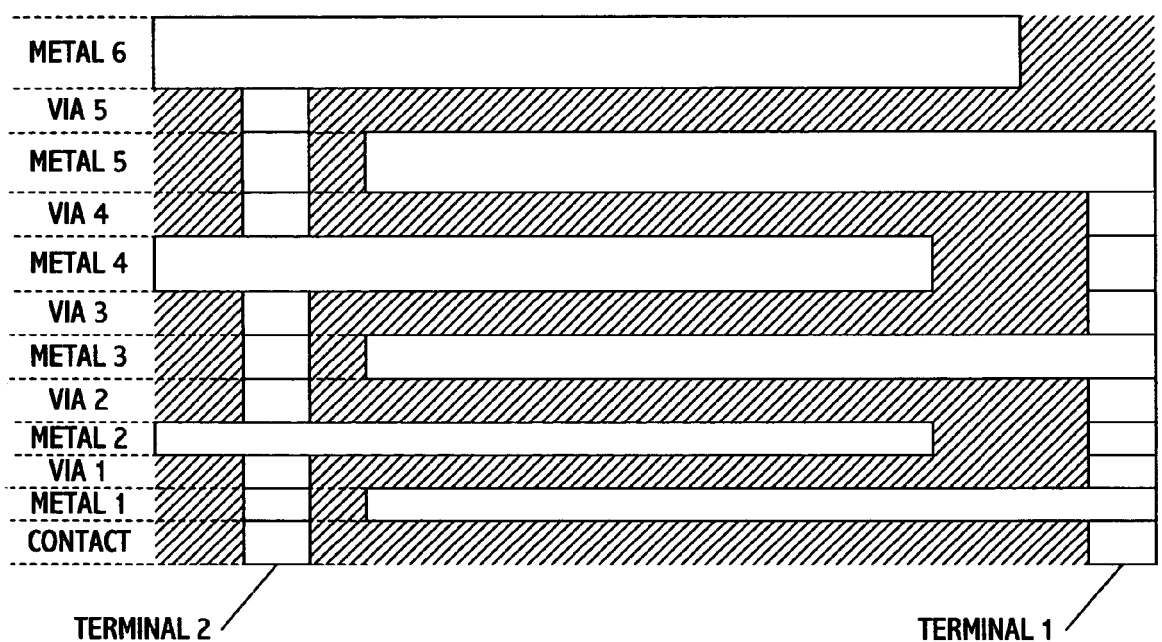

Next, a conductive layer 19 is deposited on the dielectric layer and studs to a predetermined thickness. (Block 44, FIG. 5(e)). The conductive layer may be made from a polysilicon or metal. A masking layer (not shown) is then applied and portions of the metal layer are etched away leaving a gap 20 as shown in FIG. 5(f). The portion of the conductive layer on the left side of the gap forms a second stud 21 on top of stud 17, and portion of the conductive layer on the right side serves as a first conductive layer 22 of the ultracapacitor. (Block 45).

Another dielectric layer 23 is then deposited on the conductive layer to a predetermined thickness, thereby filling the gap. (Block 46, FIG. 5(g). The thickness of this dielectric layer may be the same as layer 11 or may be different depending on the level of performance and/or charge distribution requirements of the ultracapacitor.

A masking layer is then formed over layer 23 and portions of the masking layer are etched away exposing areas where vias 25 and 26 are etched into layer 23 by reactive ion etching or another technique. (Block 47, FIG. 5(h)). Via 25 is etched at a position which coincides with stud 21 and via 26 is etched to expose a portion of conductive layer 22. A conductive material is then deposited into the vias to form studs 27 and 28, which are in respective contact with underlying stud 21 and conductive layer 22. (Block 48, FIG. 5(i)).

A conductive material is then deposited on top of dielectric layer 23 followed by lithography and etching to form the second conductive layer 29 and an aligned stude 30 of the ultracapacitor. In the figure, conductive layer 29 is shown to be of the same width as layer 22, however these widths may be different depending on the level of performance and/or charge storage distribution requirements of the ultracapacitor. A mask is applied and a portion of layer 29 is etched away, leaving a gap 24 which is filled with dielectric material during formation of a third dielectric layer 31. (Block 49, FIG. 5(j)).

Additional dieletric and conductive layers are alternately formed at predetermined thicknesses and spacings until all the layers an intervening studs of the ultracapacitor are formed. (Block 50, FIG. 3(k)). Terminals may then be formed and electrically connected to stud line or the terminals may be formed before formation of the first dielectric layer. At the conclusion of this process, preferably half the conductive layers are connected to one stud line and the remaining half to another stud line.

Figure 6A:
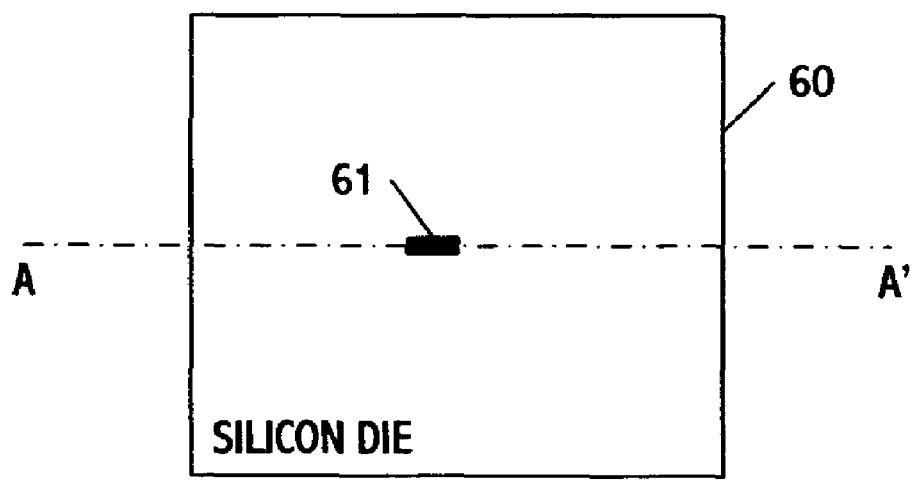
FIG. 6 (a) is a diagram showing a semiconductor die having an ultracapacitor formed thereon in accordance with one embodiment of the present invention.
FIG. 6(b) shows an equivalent circuit diagram for this ultracapacitor.
FIG. 6(c) shows a cross-sectional view of the ultracapacitor.
Figure 6B:
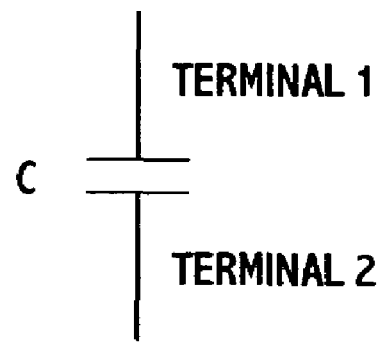
Figure 6C:
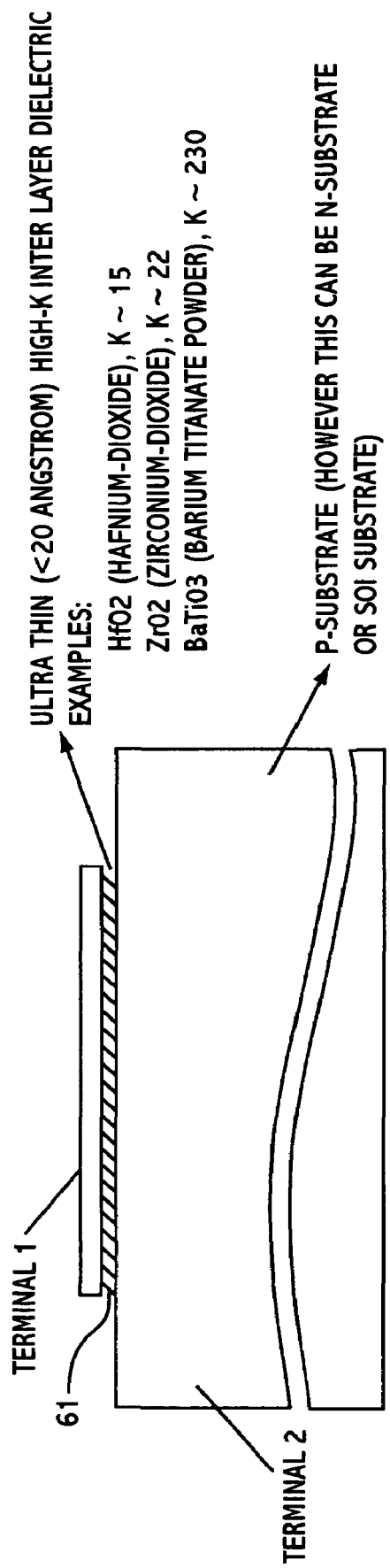

FIG. 6(a) shows a semiconductor die 60 having an ultracapacitor 61 formed thereon in accordance with one embodiment of the present invention, and FIG. 6(b) shows an equivalent circuit diagram for this ultracapacitor where $C_{uc}$ represents capacitance and terminals 1 and 2 are connected to respective stud lines of the capacitor. The die may be made of silicon or another semiconductor material. FIG. 6(c) shows a cross-sectional view of ultracapacitor 61 taken along section line A-A'. Terminal 1 is formed on top of the ultracapacitor and terminal 2 is shown as residing on a p-type substrate. In this embodiment, the ultracapacitor may have an ultra-thin width (e.g., 20 Angstroms or less) using a high-k inter-layer dielectric. The second terminal may alternatively be formed on an n-type substrate or on a silicon-on-insulator structure.

Figure 7A:
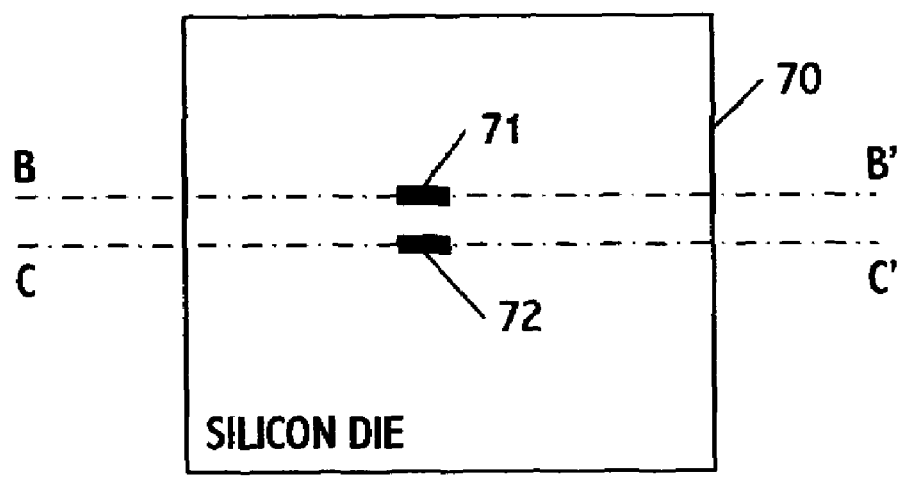
FIG. 7(a) is a diagram showing a silicon die having two ultracapacitors which are formed to be identical or different in accordance with any one or more embodiments described herein.
Figure 7B:
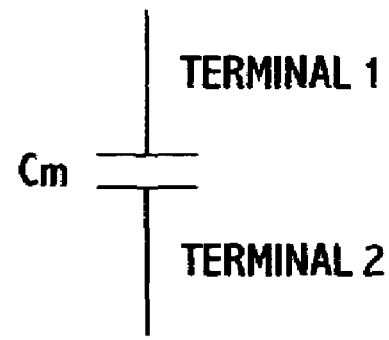
FIG. 7(b) shows an equivalent circuit diagram of at least one of the ultracapacitors.

FIG. 7(a) shows a silicon die 70 having two ultracapacitors 71 and 72 that may be formed according to the one or more of the forgoing embodiments of the present invention, and FIG. 7(b) shows an equivalent circuit diagram which may represent at least one of the ultracapacitors. The ultracapacitors may be structurally identical or different in respect to their storage capacities and/or charge distributions, e.g., ultracapacitor 71 may have a different number of conductive layers than ultracapacitor 72, different spacings between the conductive layers, different widths for their conductive layers, or a combination of the foregoing. For illustrative purposes, the capacitor in FIG. 7(b) is shown to have a capacitance $C_m$.

Figure 8A:
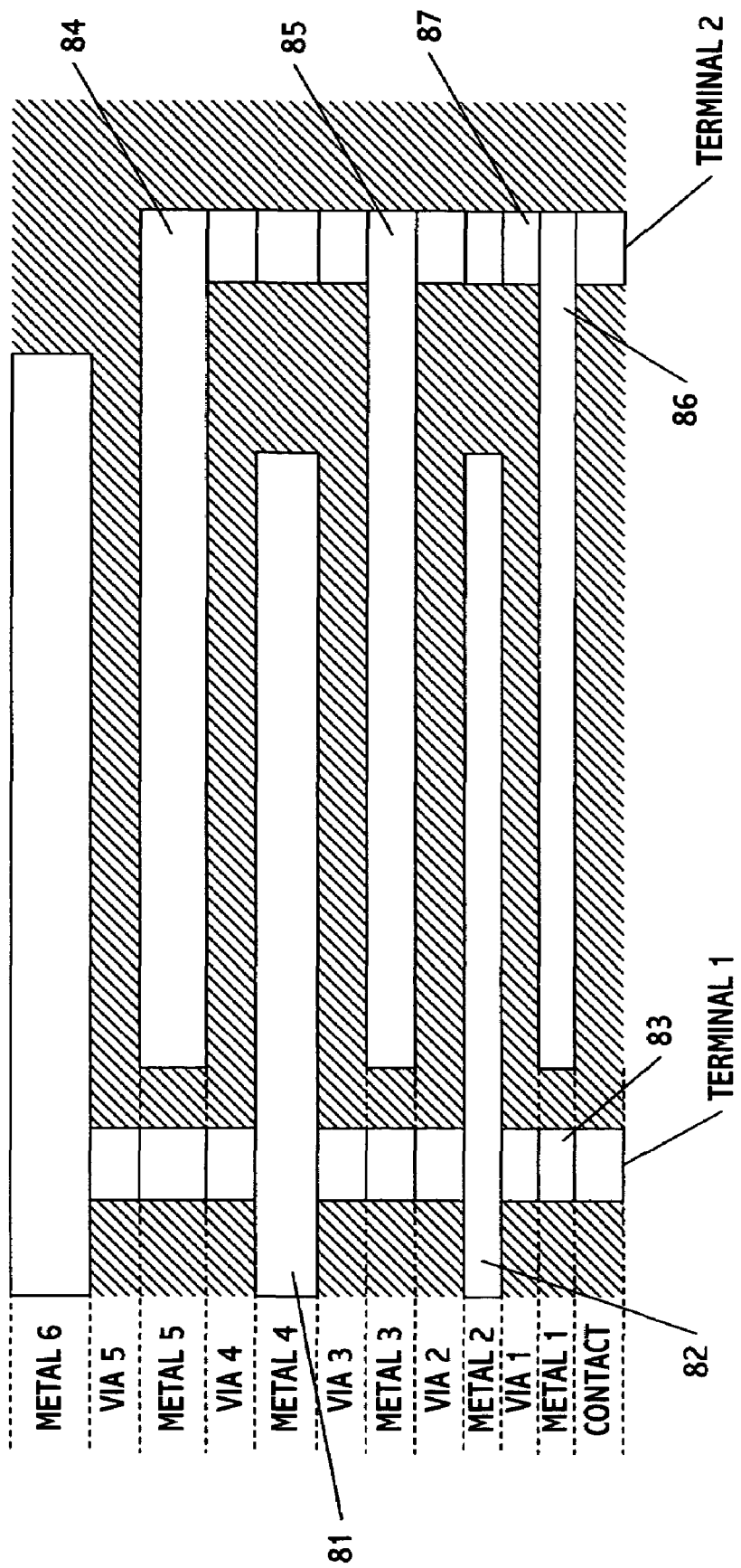
FIG. 8(a) is a diagram showing in cross-section the first ultracapacitor in FIG. 7(a)

FIG. 8(a) shows cross-sectional view of ultracapacitor 71 taken along section line B-B'. In this example ultracapacitor 71 has three conductive layers 80-82 connected to terminal 1 through stud line 83 and three conductive layers 84-86 connected to terminal 2 through stud line 87. The conductive layers are formed to have uniformly changing widths from top to bottom. Specifically, layers 80 and 84 have substantially equal widths that are the largest in the capacitive structure. Layers 81 and 85 have substantially equal widths and are of intermediate size. And, layers 82 and 86 have substantially equal widths and are the smallest in the capacitive structure. The widths of all the dielectric layers are shown to be equal.

Figure 8B:
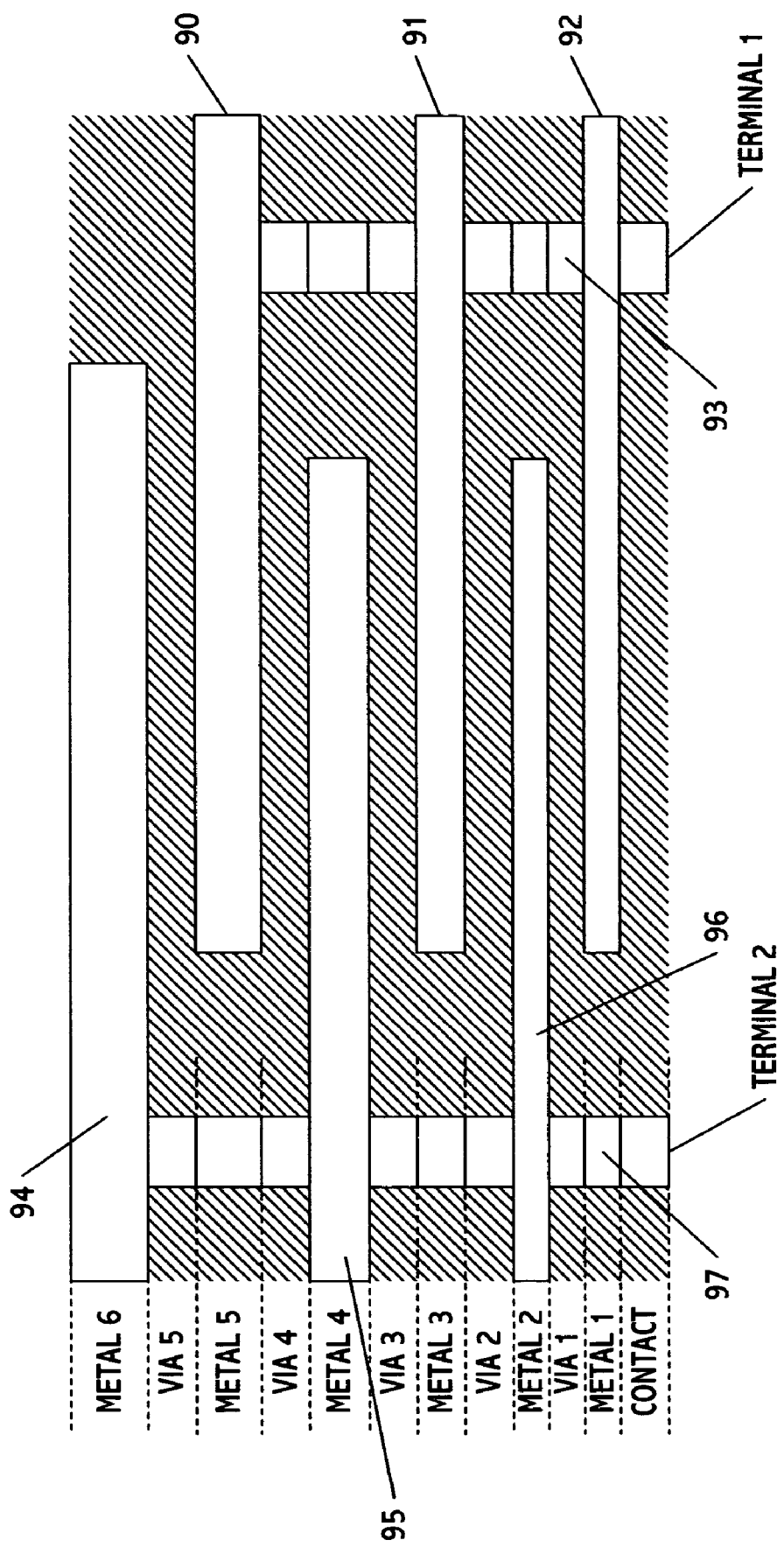
FIG. 8(b) shows the second ultracapacitor in this figure.

FIG. 8(b) shows a cross-sectional view of ultracapacitor 72 taken along section line C-C'. In this example ultracapacitor 72 has the same number of conductive layers as ultracapacitor 71. Three conductive layers 90-92 are connected to terminal 1 through stud line 93 and three conductive layers 94-96 connected to terminal 2 through stud line 97. The conductive layers are formed to have a uniformly changing widths from top to bottom. Specifically, layers 90 and 94 have substantially equal widths and are the largest in the capacitive structure. Layers 91 and 95 have substantially equal widths and are of intermediate size. And, layers 92 and 96 have substantially equal widths and are the smallest in the capacitive structure. The widths of all the dielectric layers are shown to be equal. A comparison of FIGS. 8(a) and 8(b) shows that the ultracapacitors have opposing terminal configurations.

Figure 9A:
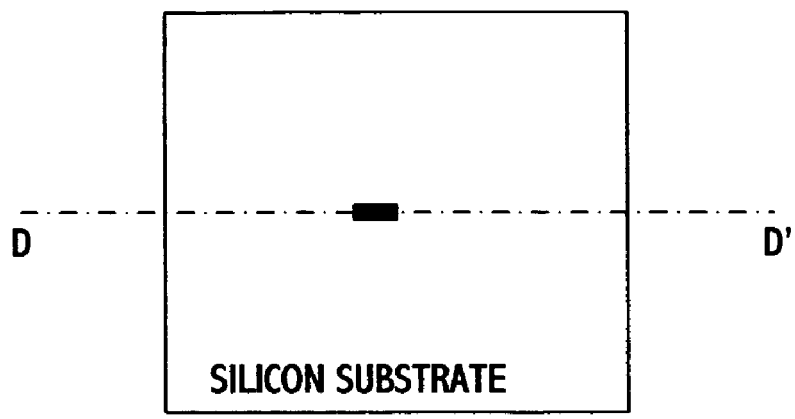
FIG. 9(a) is a diagram showing a semiconductor die including an ultracapacitor in accordance with another embodiment of the present invention.
Figure 9B:
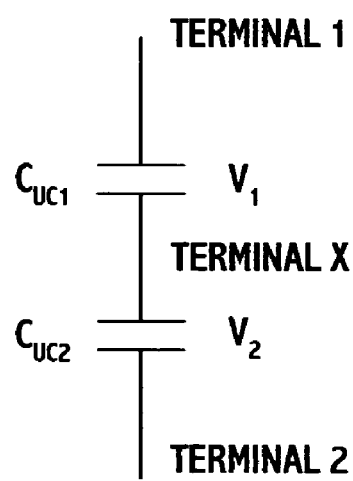
FIG. 9(b) shows an equivalent circuit diagram for this ultracapacitor.

FIG. 9(a) shows a semiconductor die 80 in accordance with another embodiment of the present invention, and FIG. 9(b) shows an equivalent circuit diagram an ultracapacitor arrangement formed thereon. This arrangement includes two ultracapacitor connected in series and having capacitances $C_{uc1}$ and $C_{uc2}$ respectively. The ultracapacitors $C_{uc1}$ and $C_{uc2}$ may be the same or different depending on the application. The input terminal is shown as terminal 1, the output terminal is shown as terminal 2, and an intermediate terminal connecting the ultracapacitors is shown as terminal x.

Because of the series connection, the total voltage $V_{total}$ of the ultracapacitor arrangement equals a sum of the voltages stored in each ultracapacitor, $V_{total}=V_1+V_2$, and the total charge is equal to the charge on the total capacitance. Given Q=CV, the total capacitance of the ultracapacitor arrangement may therefore be expressed as: $1/C_{total}=1/C_{uc1}+1/C_{uc2}$.

Figure 10:
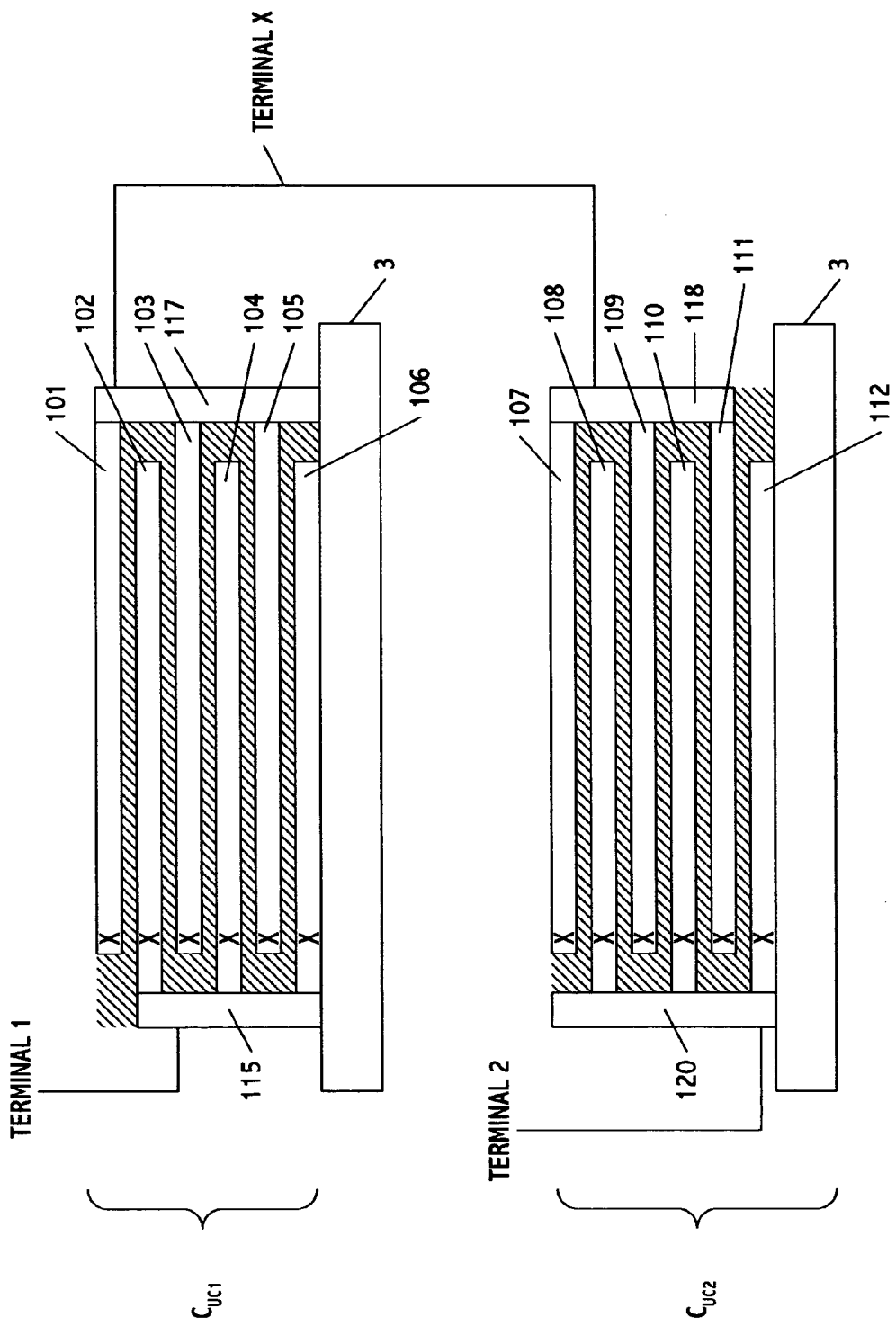
FIG. 10 is a diagram showing an example in cross-section of how the ultracapacitor in FIG. 9(a) may be formed.

FIG. 10 shows an example of how terminal x may be connected to ultracapacitor sections in the foregoing embodiment, taken along section line D-D'. In this example, conductive layers 101-106 form first ultracapacitor $C_{uc1}$ formed on substrate 3 and conductive layers 107-112 form second ultracapacitor $C_{uc2}$. Input terminal 1 is connected to stud 115, output terminal 2 is connected to stud line 120 at a location which coincides with layer 112, and intermediate terminal x connects stud line 117 in the first ultracapacitor to stud line 118 of the second ultracapacitor. Terminal x therefore establishes the series connection between the ultracapacitors.

Figure 11:
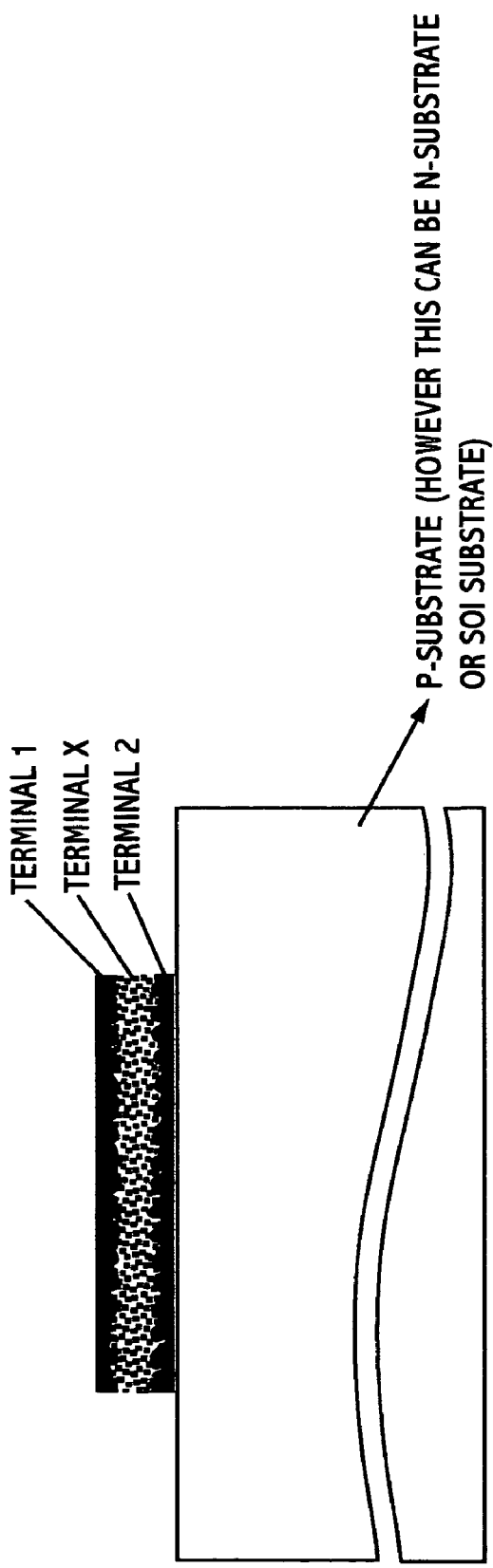
FIG. 11 is a diagram showing a side view of the ultracapacitor of FIG. 10.

FIG. 11 shows an example of how the aforementioned embodiment may be implemented. In this example, terminals 1 and 2 may be made of a porous carbon material or doped silicon and more specifically may be a conductive carbon or silicon nanotube. Intermediate terminal x may be made of potassium hydroxide. The underlying substrate may be made from a p-type or n-type material or may have a silicon-on-insulator structure. In this figure, the dots represent a conducting material that forms a capacitive connection between terminals 1 and 2. The jagged edges increase the surface area of the capacitance between terminals 1 and 2 and terminal x. Terminal x is preferably made from a different material in order to establishing a capacitive connection between terminals 1 and 2 instead of a resistive connection and to prevent the possibility of an electrical short. Also, terminal x is not tapped out externally in this embodiment.

Figure 12:
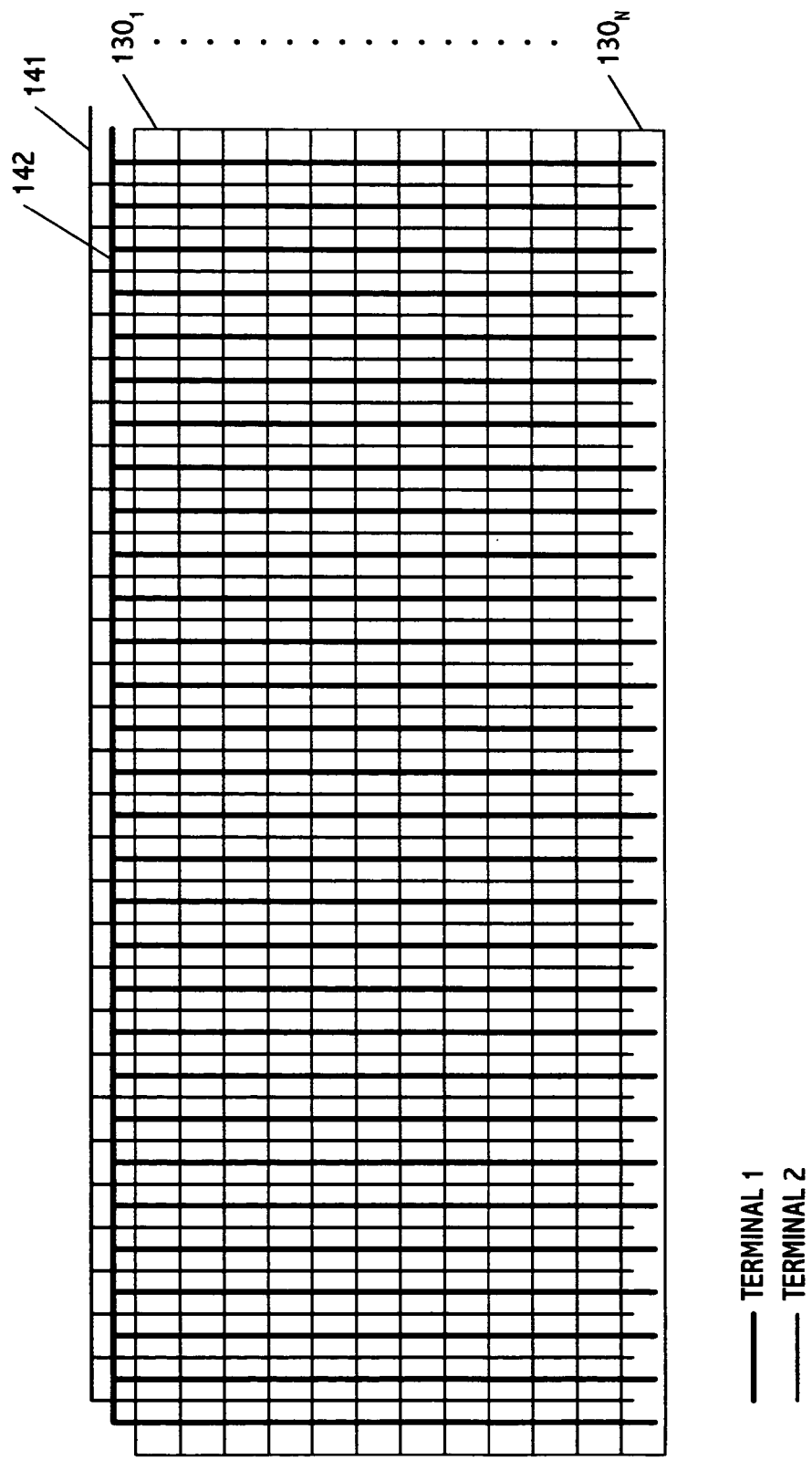
FIG. 12 shows in cross-section a stacked ultracapacitor in accordance with one embodiment of the present invention.

FIG. 12 shows in cross-section stacked substrates each of which includes an ultracapacitor in accordance one or more of the embodiments of the present invention. Stacking the ultracapacitors is advantageous because it increases the capacitance per unit area. In this embodiment, a plurality of substrates $130_1$ to $130_N$ are stacked one on top of the other. Common input and output terminals 141 and 142 are then used to connect the capacitors. By stacking the capacitors in this manner, a very large charge can be stored for serving a variety of purposes including but not limited to the formation of rechargeable batteries, e.g., where terminal 1 is set to 5V or another voltage and terminal 2 to 0V. Any of the embodiments of the ultracapacitor described herein may be implemented to perform this rechargeable battery application.

One advantage of using the ultracapacitor embodiments for this application is reduced charging times, e.g., charging time will be very small and the ultracapacitor may be recharged to full capacity a larger number of times compared with other rechargeable battery structures which have been proposed. One non-limiting application of using the ultracapacitor embodiments of the present invention is as a rechargeable power source for a portable computing device such as laptop and notebook computers, personal digital assistants, and telecommunication devices including but not limited to mobile phones which may or may not be web-enabled. In these embodiments, it may be preferable to store a charge in the range of 1V-5V in the ultracapacitor, however greater or lesser voltages outside this range may also be stored.

Capacitors have traditionally been limited in terms of their useful lives. For example, when used as an energy source, the voltage across a capacitor will drop linearly with energy consumption by the load. In practice, the voltage requirements of the load may limit the useful range of the capacitor. That is, although some energy may be left in the capacitor after a period of use, the remaining voltage stored in the capacitor cannot be extracted because it is too low to meet the minimum requirements for driving the load.

Figure 13:
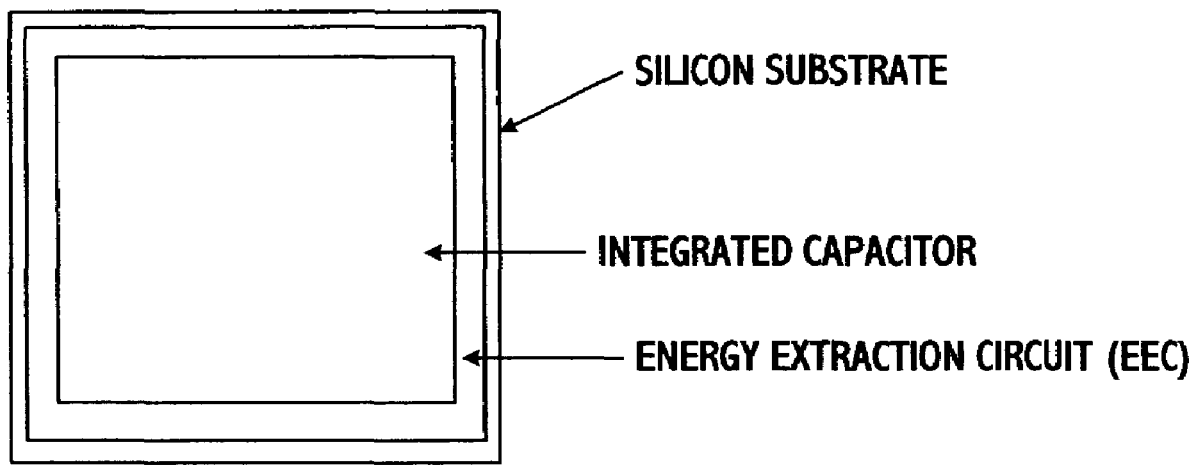
FIG. 13 shows is a diagram showing an energy extraction circuit in accordance with one embodiment of the present invention.

FIG. 13 shows an energy extraction circuit 200 in accordance with one embodiment of the present invention. This circuit is formed on a semiconductor substrate 210 and coupled to a capacitor 220 to extract energy therefrom, preferably during a time when the capacitor voltage is below minimum requirements for driving a load. While the energy extraction circuit and capacitor may be formed on the same chip as shown, in alternative embodiments these two elements may be formed on different chips or otherwise separately provided. Also, the capacitor may be any type including one of the embodiments of the ultracapacitor of the present invention previously discussed. Operation of the energy extraction circuit may be understood as follows.

Figure 14:
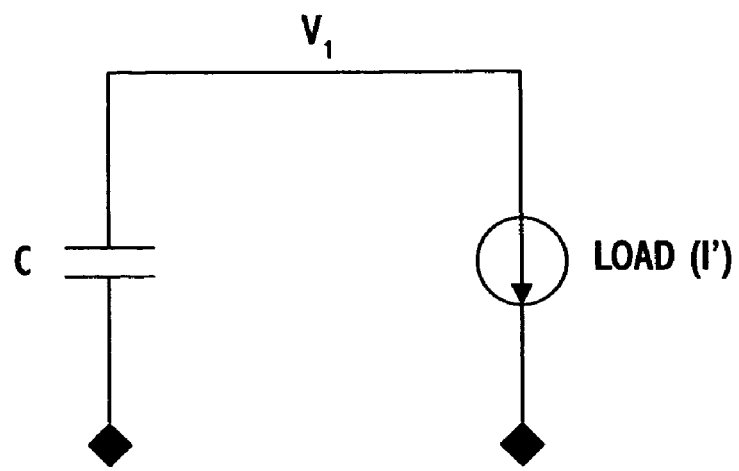
FIG. 14 shows a typical arrangement where a capacitor is used as an energy source to drive a load.
Figure 15:
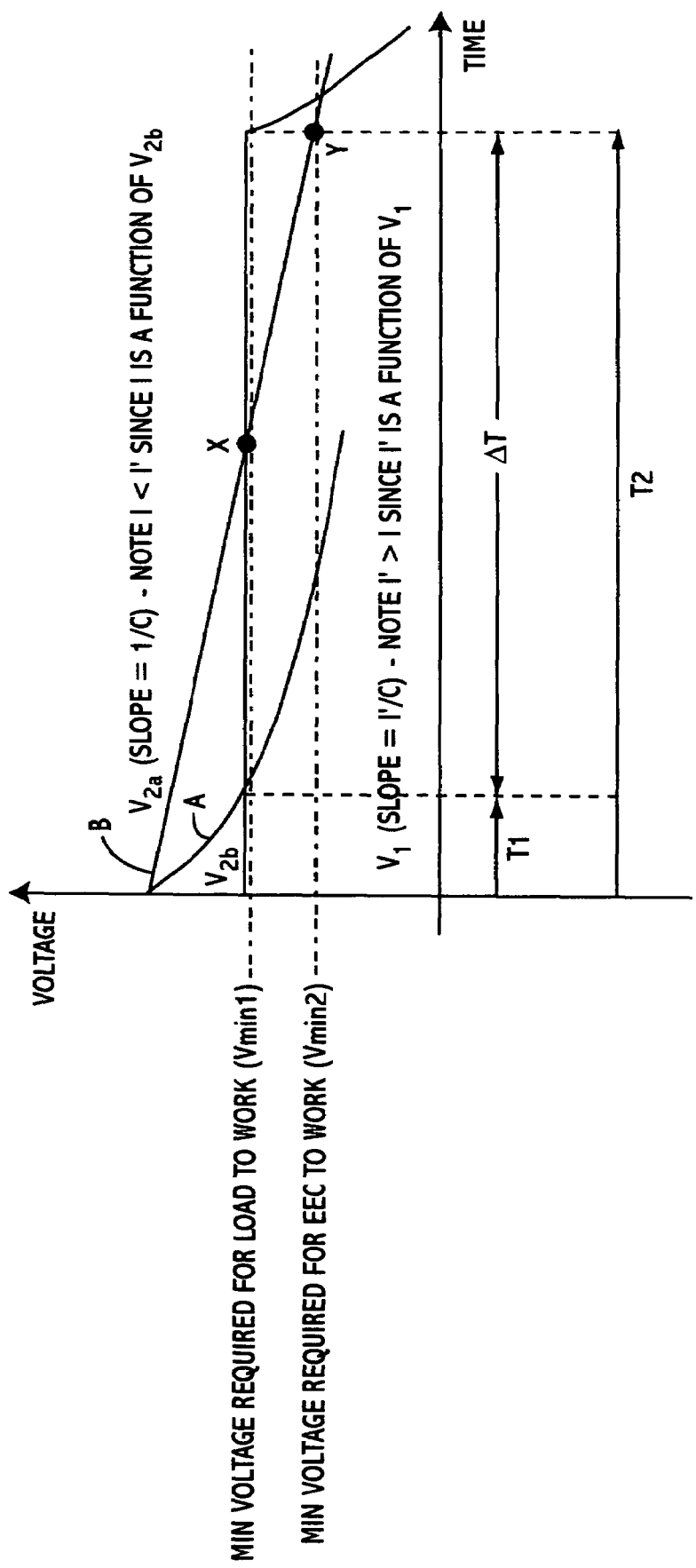
FIG. 15 is a graph showing how the energy extraction circuit of FIG. 13 is able to extend the useful life of a capacitor compared with the arrangement in FIG. 14.

FIG. 14 shows a typical arrangement where a capacitor C drives a load having a current I', and FIG. 15 is a graph showing the change in capacitor voltage that takes place over time. More specifically, in the graph $V_1$ represents the voltage output from the capacitor and $V_{Min1}$ represents the minimum voltage required to drive the load. Curve A shows how the energy stored in the capacitor is consumed over time, which may be expressed as V1 (slope=I'/C) and thus I' is shown to be a function of the capacitor voltage. When the capacitor voltage $V_1$ is consumed to the point where it intersects with $V_{Min1}$, the remaining voltage in the capacitor is unable to drive the load. Consequently, the capacitor must be recharged before operation of the circuit can resume. The useful life of the capacitor is shown as period T1.

Figure 16:
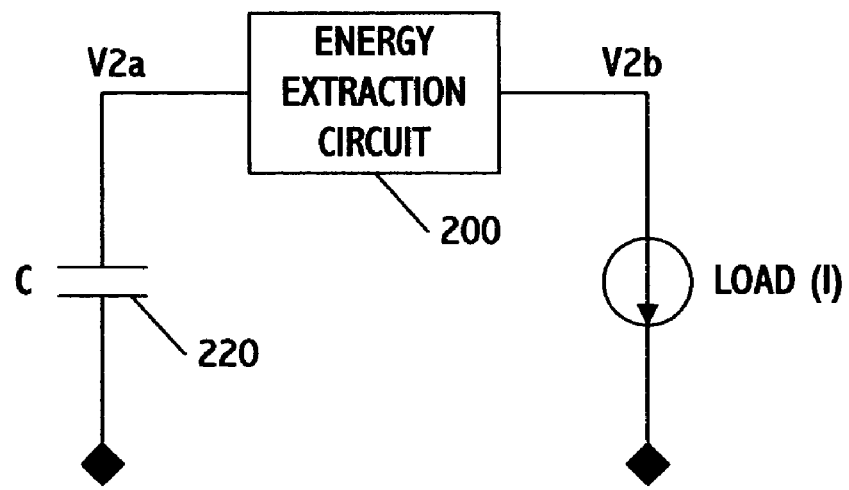
FIG. 16 shows an equivalent circuit diagram of the energy extraction circuit in FIG. 13.

FIG. 16 shows an equivalent circuit diagram of the energy extraction circuit 200 shown in FIG. 13. The performance of this circuit is also shown in FIG. 15 on a comparative basis. Specifically, in the graph $V_{2a}$ shows the voltage that exists before the energy extract circuit and $V_{2b}$ shows the voltage that exists after the energy extract circuit. Curve B shows that when ultracapacitor 220 is charged and used as an energy source, voltage $V_{2a}$ output from the capacitor will drop linearly as energy is consumed by the load. Voltage $V_{2b}$, on the other hand, remains at a constant value which coincides with $V_{Min1}$, the minimum voltage required to drive the load, throughout a period T2. The slope of Curve B may be expressed as I/C, where I represents the current through the load. Here, I<I' since I is a function of $V_{2b}$. For the slope of Curve A, I'>I since I' is a function of $V_1$.

Curve B shows that when the voltage $V_{2a}$ stored in the capacitor is consumed to the point (X) where it intersects with $V_{Min1}$, the remaining capacitor voltage is no longer sufficient in and of itself to drive the load. At this point, circuit 200 may be enabled to extract all or a portion of the remaining voltage in the capacitor to drive the load for an extended period of time $\Delta T=T2-T1$. While the output voltage $V_{2a}$ of the capacitor is lower than the minimum required voltage to drive the load during this time $\Delta T$, the energy extraction circuit may operate to amplify this voltage at least up to minimum voltage $V_{Min1}$ (e.g., to maintain $V_{2b}=V_{Min1}$ or some larger voltage)

until the capacitor voltage $V_{2a}$ falls to a point (Y) that corresponds to a minimum operating voltage $V_{Min2}$ of the energy extraction circuit.

Because the minimum operating voltage of the energy extraction circuit is lower than the minimum operating voltage of the load, energy stored in the capacitor at a time when $V_{2a} < V_{Min1}$ (which cannot be accessed by the load) may be accessed and processed by circuit 200 to provide a voltage $V_{2b}$ which can be used to continue to drive the load. At point Y, the energy extraction circuit is disabled either automatically or on demand, thereby producing a sharp drop off of $V_{2b}$. The load also ceases to be driven at this time.

Preferably, the energy extraction circuit is automatically enabled when, for example, a detector (not shown) detects that the output voltage of the capacitor falls below a predetermined threshold value, which may correspond to point X or some other point (e.g., a voltage greater than $V_x$). However, circuit 200 may enabled on demand, for example, through a user-initiated control signal. Also, while $V_{2b}$ is shown to equal $V_{Min1}$ throughout the effective operating range T2 of the circuit, $V_{2b}$ in alternative embodiments of the invention $V_{2b}$ may be greater than $V_{min1}$. For example, $V_{2b}$ may assume a value greater than $V_{Min1}$ up to point X and then assume a lower value (e.g., $V_{2b} = V_{Min1}$) at that point, or $V_{2b}$ may set to a constant value above $V_{Min1}$.

The energy extraction circuit may perform any one of a number voltage conversion/regulation schemes to extend the useful life of the ultracapacitor. Examples of this circuit and the operations they perform are discussed below.

Figure 17:
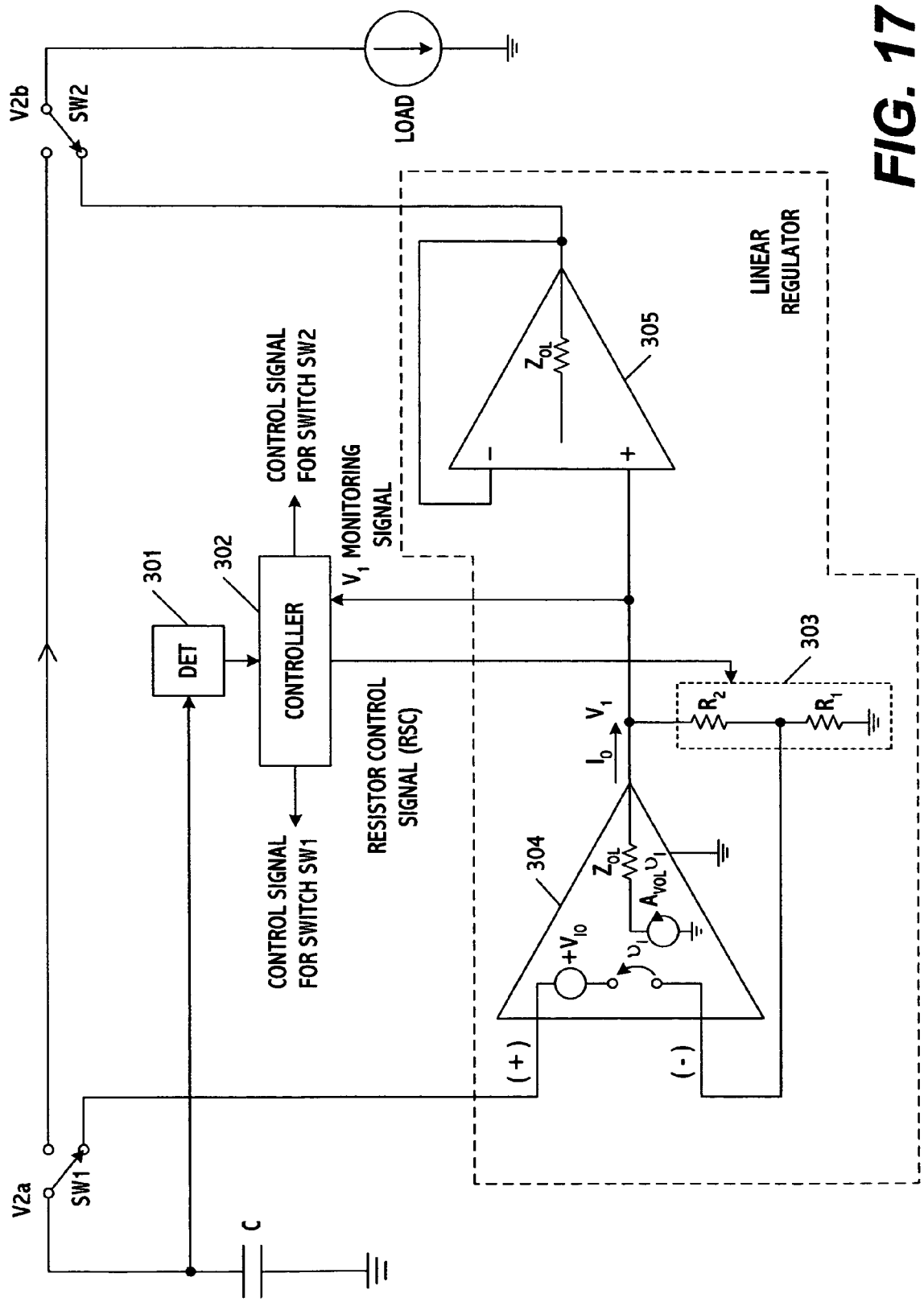
FIG. 17 shows an energy extraction circuit which extends the useful life of a capacitor using a linear regulator.

FIG. 17 shows an energy extraction circuit that extends the useful life of a capacitor by performing a linear regulation function. This circuit includes a detector 301, a controller 302, and a linear regulator 303. The detector detects a voltage $V_{2a}$ output from the capacitor and inputs a signal indicating the same into the controller. The controller compares the detected voltage to a reference voltage, which, for example, may equal or otherwise be based on the minimum operational voltage of the load. As long as voltage $V_{2a}$ remains above the reference voltage, switches SW1 and SW2 are controlled to bypass the linear regulator. However, once voltage $V_{2a}$ equals or falls below the reference voltage, the controller generates switching signals to connect the linear regulator between the capacitor and load.

The linear regulator includes two amplifiers 304 and 305 connected in series. The first amplifier 304 has a non-inverting terminal connected to receive voltage $V_{2a}$ and in inverting terminal connected to a resistor network which is formed from two variable resistors $R_1$ and $R_2$ which together regulate the output voltage $V_1$ of amplifier 304. This output voltage may be expressed as follows:

$$V_1 = A_{vol} V_i - Z_o I_o = A_{vol}\{(V_{ref} \pm V_{io}) - V_o \beta\} - Z_o I_o \quad (1)$$

where $A_{vol}$ is the amplifier open loop gain, $V_{io}$ is the input offset voltage, $Z_{ol}$ is the open loop output impedance, $\beta$ is the feedback ratio (which may be less than or equal to 1), $I_o$ is the output current, and $v_i$ is the true differential input voltage. The feedback ratio may be expressed as a ratio of the variable resistors, $$\beta = \frac{R_1}{R_1 + R_2}.$$

Equation (1) may be reformulated as follows:

$$V_1 = \frac{(V_{ref} + V_{io}) - \frac{Z_{io}}{A_{vol}} I_o}{\beta + \frac{1}{A_{vol}}} \quad (2)$$

If the amplifier open loop gain is infinite, Equation (2) may be reduced to:

$$V_1 = \frac{1}{\beta}(V_{ref} \mp V_{io}) = (V_{ref} \mp V_{io})\left(1 + \frac{R_1}{R_2}\right) \quad (3)$$

In many cases, the input offset voltage may be considered negligible. Thus, Equation (3) may be reduced to:

$$V_1 = V_{ref}\left(1 + \frac{R_1}{R_2}\right) \quad (4)$$

From Equation (4), it is clear that the output voltage of amplifier 304 may be set to any value equal to or greater than $(V_{ref} \pm V_{io})$ by varying the value of resistors $R_1$ and $R_2$. Preferably, the output voltage is amplified to a value sufficient to drive the load (illustratively shown as voltage $V_{2b}$) even though voltage $V_{2a}$ has fallen below the minimum operating voltage of the load.

Extracting voltage from the capacitor under the aforementioned conditions causes $V_{2a}$ to continue to reduce. Consequently, from Equation (4) it is clear that $V_1$ will become reduced by a proportional amount. To maintain $V_{2b}$ at the minimum operating voltage of the load during times after point X in FIG. 15, the controller may continuously monitor voltage $V_1$ and output a control signal RSC for varying the ratio of resistors $R_1$ and $R_2$ to maintain $V_{2b}$ at the minimum operating voltage of the load. Thus, in this embodiment of the present invention the linear regulator is able to extend the useful life of the capacitor beyond the minimum operating voltage of the load for a time illustratively shown as $\Delta T$ in FIG. 15.

In spite of the adjustments made to the feedback resistors, there will come a time when the output voltage of the capacitor falls below the minimum voltage required for the linear regulator to function. This time is shown at point Y in FIG. 15. In order to compensate for this situation, for times after point X the controller may compare the output voltage of the capacitor to a second reference value, which is equal to or otherwise based on the minimum operating voltage of the linear regulator. When $V_{2a}$ equals or falls below this voltage, the controller may output switching signals to disconnect the linear regulator from the circuit or to place the switches in a default position. A warning signal may then be output from the controller to alert a user or a host system of the low-voltage condition.

While optional, the second amplifier 305 of the linear regulator is included to normalize or lower the output impedance of the first amplifier. Preferably, the gain/feedback factor of the second amplifier is set to unity in order to minimize the output impedance and thus to improve the overall performance of the connection to the load. The two-amplifier configuration is therefore advantageous because it allows capacitor voltages less than the minimum operating voltage of the load to be amplified up to this level while simultaneously achieving low output impedance.

Figure 18:
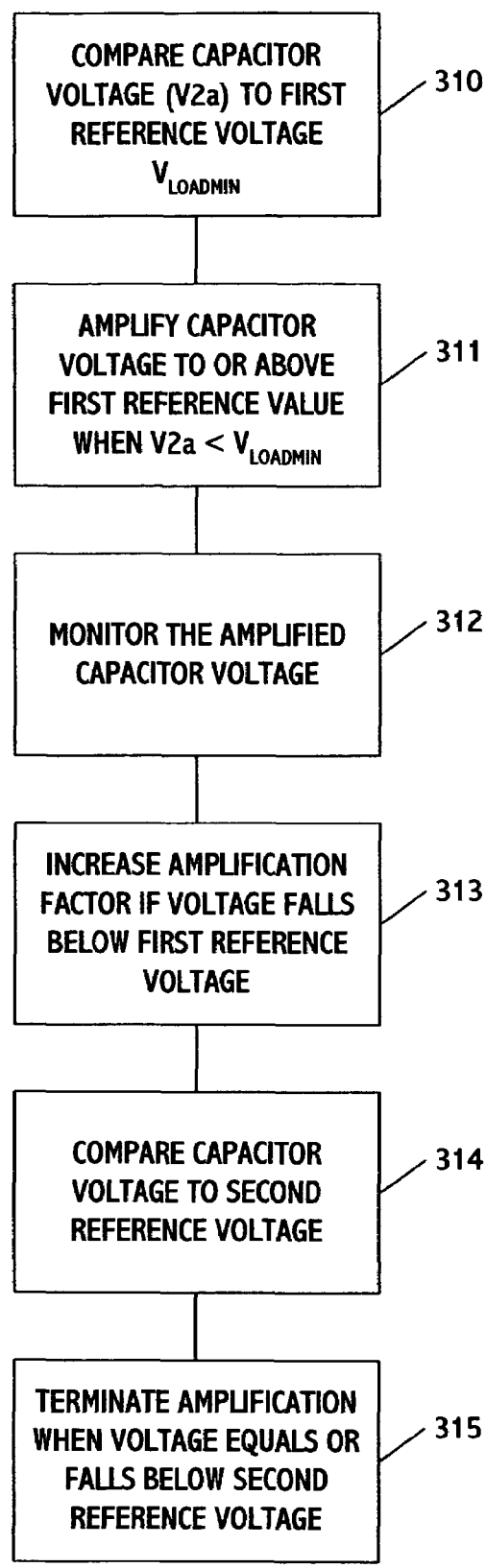
FIG. 18 shows functional blocks included in a method for extracting energy from a capacitor using a linear regulator such as the one shown, for example, in FIG. 17.

FIG. 18 shows functional blocks included in a method for extracting energy from a capacitor using a linear regulation scheme performed, for example, by the circuit of FIG. 17. While the capacitor is coupled to the load, the capacitor output voltage is compared to a first reference voltage, which, for example, may be equal to or otherwise based on the minimum operating voltage of the load, e.g., $V_{load\,min}$ (Block 310). When the capacitor voltage equals or falls below the first reference voltage, voltage $V_{2a}$ is amplified up to at least the minimum operating voltage $V_{2b}$ of the load. (Block 311).

Thereafter, the amplified voltage is monitored to ensure that it remains at least the minimum operating voltage. (Block 312). As the amplified voltage falls below the minimum value (because of the continued depletion of voltage from the capacitor), amplification of the output capacitor voltage is increased proportionally in order to maintain $V_{2b}$ at or above the minimum operating voltage of the load. (Block 313).

During this time, the capacitor voltage is also compared to a second reference voltage which, for example, is equal to or based on the minimum operating voltage of the energy extraction circuit that performs the amplification function. (Block 314). When the capacitor voltage equals or falls below the second reference voltage, the energy extraction process is terminated and optionally a signal is generated to alert a user or host system of the low-voltage condition. (Block 315).

Figure 19:
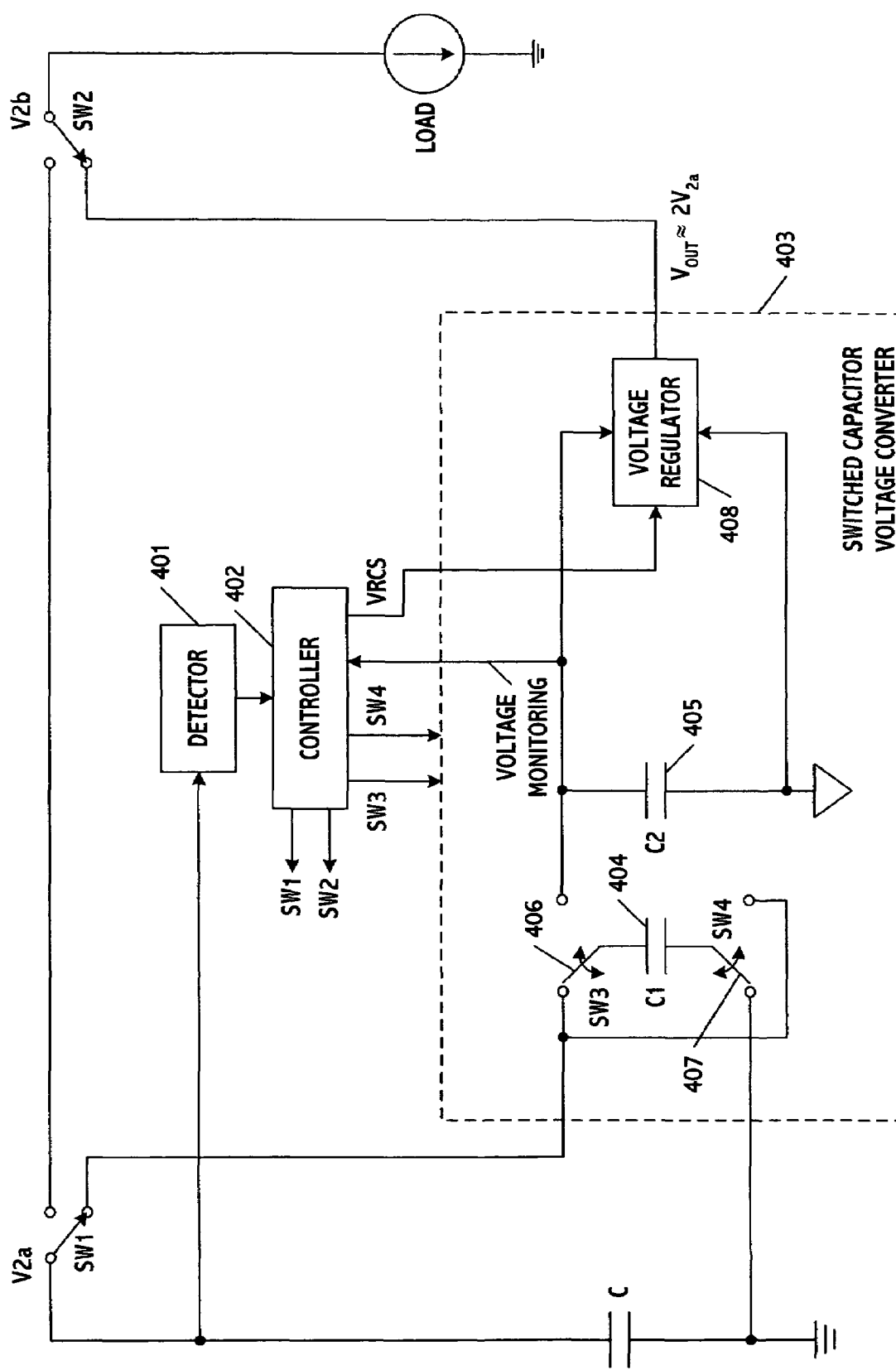
FIG. 19 shows an energy extraction circuit which extends the useful life of a capacitor using a switched capacitor voltage converter.

FIG. 19 shows an energy extraction circuit which extends the useful life of a capacitor by performing a switched-capacitor voltage conversion. The conversion is preferably performed using a voltage-doubler circuit 403, although other types of capacitor-based conversion circuits may alternatively be used.

The voltage-doubler circuit includes a pump capacitor 404 connected in parallel to an output capacitor 405. Switches 406 and 407 control connection of the pump capacitor to capacitor C during a charging cycle and connection of the pump capacitor to the output capacitor during a discharging cycle. As shown, during the discharging cycle the pump capacitor is connected in series to capacitor C, which accounts for doubling of the voltage stored in capacitor C in the output voltage.

In operation, a detector 401 detects the voltage $V_{2a}$ output from the capacitor and inputs a signal indicating the same into a controller 402. The controller compares the detected voltage to a reference voltage, which, for example, may equal or otherwise be based on the minimum operational voltage of the load. As long as voltage $V_{2a}$ remains above the reference voltage, switches SW1 and SW2 are controlled to bypass the linear regulator. However, once voltage $V_{2a}$ equals or falls below the reference voltage, the controller generates switching signals to connect the linear regulator between the capacitor and load.

Either beforehand or at the time of connection, the controller outputs switching signals to connect the pump capacitor to capacitor C during a charging cycle. This connection is maintained for a predetermined time until capacitor 404 stores a charge at least substantially commensurate with voltage $V_{2a}$. At that time, the controller outputs switching signals to connect the pump capacitor to the output capacitor. Because the pump capacitor is connected in series with capacitor C during this time (which may be referred to as a discharging cycle), the output capacitor is charged to a value which equals a sum of the charge stored in the pump capacitor and the charge stored in capacitor C, e.g., $V_{out}=2\,V_{2a}$.

Because the voltage output from capacitor 405 ($2V_{2a}$) may be substantially greater than the minimum operating voltage of the load ($V_{2b}$), a voltage regulating circuit 408 may be included in the converter. The voltage regulator preferably operates to adjust the output voltage $V_{out}$ so that it at least substantially equals $V_{2b}$, when $V_{out}$ exceeds $V_{2b}$ or some other predetermined voltage. The amount of adjustment may be determined by the controller, taking into consideration the degree to which the output capacitor voltage diminishes after time X in FIG. 15. That is, as the output capacitor voltage reduces over time because of a proportional reduction in the voltage stored in capacitor C, the controller generated a voltage regulation control signal VRCS for reducing the amount of regulation (e.g., reduction) performed on the output voltage of capacitor 405.

The voltage regulator circuit 408 may be any one of a variety of circuits. For example, the voltage regulator may be a low dropout linear regulator, which not only regulates the output but also preferably reduces ripple that takes place in the converter. Alternatively, the voltage regulator may include a circuit which varies the duty cycle of the switch control signals SW3 and SW4 with the output of an error amplifier, which compares the output voltage with a reference value. Another type of voltage regulator includes an error amplifier which controls the on-resistance of switching that takes place in the converter. Each of these circuits may be responsive to control signals output from controller 402 to ensure that $V_{out}$ at least coincides with the minimum operating voltage of the load.

In spite of the adjustments made by the voltage regulator, there will come a time when the output voltage of capacitor 405 falls below the minimum voltage required for the converter to function. This time is shown at point Y in FIG. 15. To compensate for this situation, for times after point X the controller may compare the output voltage of capacitor 405 to a second reference value, which is equal to or otherwise based on the minimum operating voltage of the converter. When $V_{2a}$ equals or falls below this voltage, the controller may output switching signals to disconnect converter 403 from the circuit or to place the switches in a default position. A warning signal may then be output from the controller to alert a user or a host system of the low-voltage condition.

Figure 20:
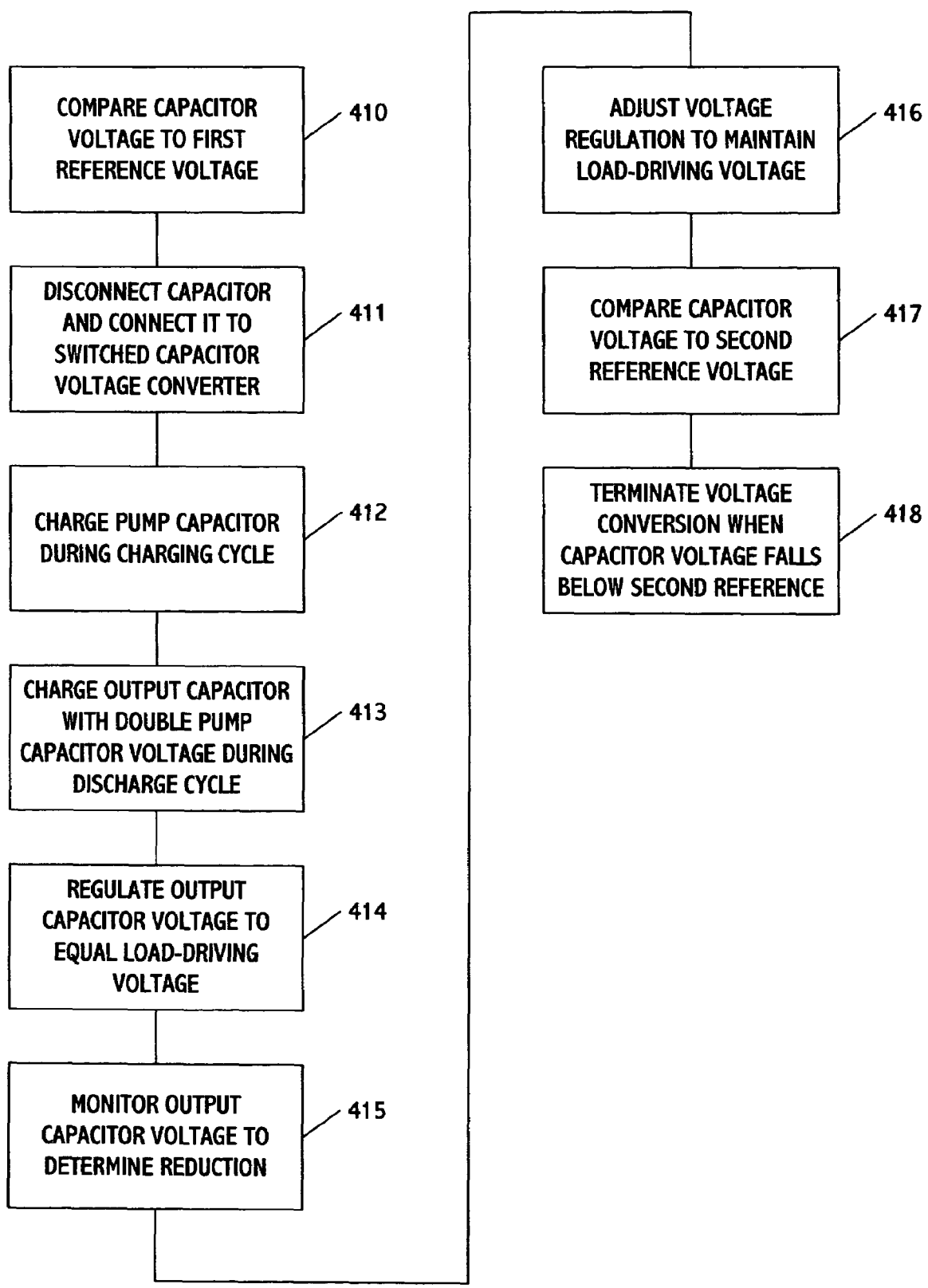
FIG. 20 shows functional blocks included in a method for extracting energy from a capacitor using a switched capacitor voltage converter such as the one shown, for example, in FIG. 19.

FIG. 20 shows functional blocks included in a method for extracting energy from a capacitor using a switched capacitor voltage conversion performed, for example, by the circuit of FIG. 19. While the capacitor is coupled to the load, the capacitor output voltage is compared to a first reference voltage, which, for example, may be equal to or otherwise based on the minimum operating voltage of the load, e.g., $V_{load\,min}$ (Block 410). When the capacitor voltage equals or falls below the first reference voltage, the conversion circuit is connected between the capacitor and load. (Block 411). More specifically, the pump capacitor of the converter is connected to the load so that it charges up to $V_{2a}$ during a charging cycle. (Block 412).

During a discharging cycle the pump capacitor is connected to the output capacitor while the pump capacitor is connected in series with capacitor C. (Block 413). The resulting voltage from the output capacitor is twice the voltage stored in the pump capacitor (e.g., $2V_{2a}$). This voltage is then regulated by a second voltage conversion to preferably coincide with a minimum operating voltage of the load. (Block 414). Charging and discharging cycles continue to be performed for the pump and output capacitors to drive the load.

During this time, the output capacitor voltage is monitored to determine the extent to which it has lessened as a result of a proportional reduction in the voltage stored in capacitor C. (Block 415). As the output capacitor voltage falls below the minimum value (because of the continued depletion of voltage from capacitor C), the amount of voltage regulation performed on the output capacitor voltage is reduced or otherwise adjusted to maintain at least the minimum load-driving voltage. (Block 416).

Also during this time, the voltage stored in capacitor C is compared to a second reference voltage which, for example, is equal to or based on the minimum operating voltage of the switched capacitor voltage converter. (Block 417). When the capacitor voltage equals or falls below the second reference voltage, the energy extraction process is terminated and optionally a signal is generated to alert a user or host system of the low-voltage condition. (Block 418).

An energy extraction circuit that extends the useful life of a capacitor may also be implemented with or without adiabatic schemes to reduce loss. The term "adiabatic" refers to a process where charge transfer take place without generating any or a substantial amount of heat.

Figure 21:
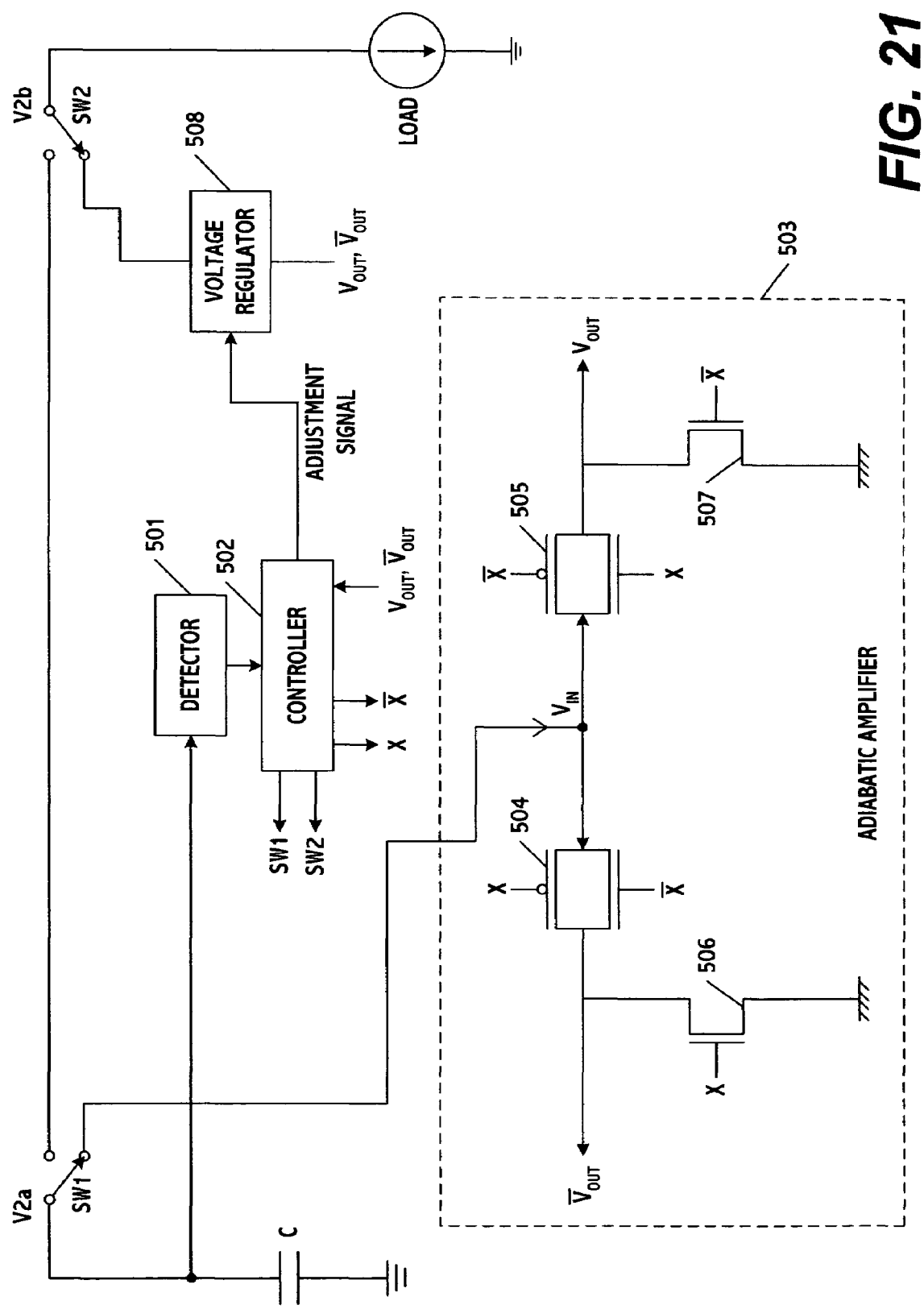
FIG. 21 shows an energy extraction circuit which extends the useful life of a capacitor using an adiabatic amplifier.

FIG. 21 shows an energy extraction circuit which includes an adiabatic amplifier for converting low-voltage stored in capacitor C into a load-driving voltage. More specifically, this circuit includes a detector 501, a controller 502, and an adiabatic amplifier 503, the latter of which is formed from a pair of transmission gates 504 and 505 and a pair of clamping transistors 506 and 507 respectively connected to the transmission gates. Preferably, the transistors are implemented in nmos and the transmission gates in CMOS, e.g., each transmission gate may be formed from an nFET and pFET connected in parallel.

The input $V_{in}$ into the amplifier is connected to a node between the transmission gates, which generate an amplified differential output (shown as $V_{out}$ and $\overline{V}_{out}$) from the input voltage. The differential output is generated in accordance with control signals x and $\overline{x}$ generated by controller 502. A voltage regulator 508 may optionally be connected to control the level of the output voltages $V_{out}$ and $\overline{V}_{out}$ generated by the amplifier.

Figure 22:
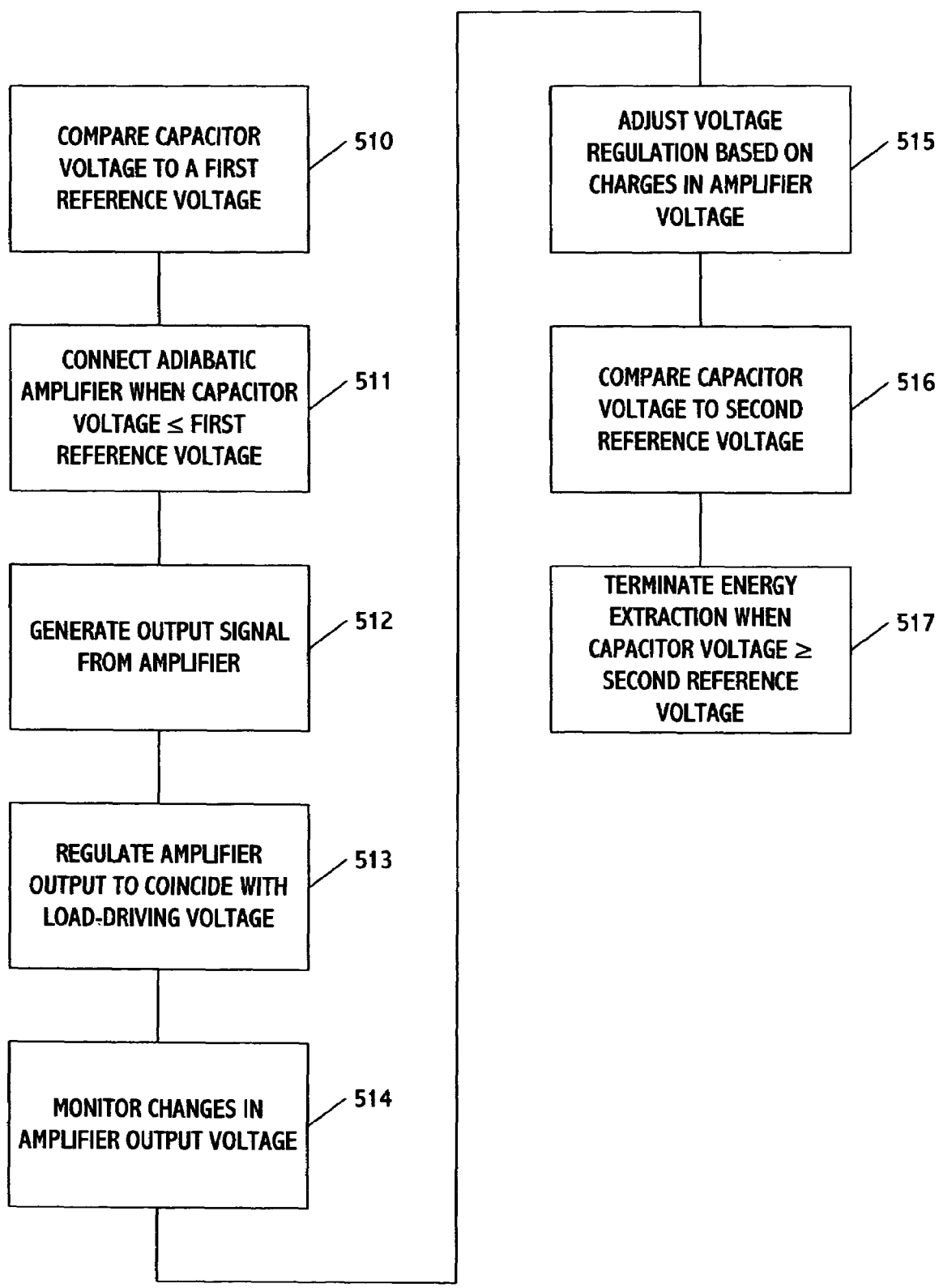
FIG. 22 shows functional blocks included in a method for extracting energy from a capacitor using an adiabatic amplifier such as the one shown, for example, in FIG. 21.

FIG. 22 shows functional blocks included in a method for extracting energy from a capacitor using an adiabatic amplifier such as shown in FIG. 21. While capacitor C is coupled to the load, the capacitor voltage is detected by the detector and compared to a first reference voltage by the controller, which, for example, may be equal to or otherwise based on the minimum operating voltage of the load, e.g., $V_{load\,min}$ (Block 510). When the capacitor voltage equals or falls below the first reference voltage, the controller generates signals to close switches SW1 and SW2, thereby connecting the adiabatic amplifier between the capacitor and load. (Block 511).

Once the amplifier is connected, the controller generates a combination of control signals that will activate one of the transmission gates to output an amplified version of the capacitor voltage, input as $V_{in}$. (Block 512). For example, when x and $\overline{x}$ have logical values of 1 and 0 respectively, transistor 507 is turned off and transmission gate 505 passes the amplified input voltage through the $V_{out}$ terminal to drive the load. At the same time, transmission gate 504 is rendered inactive and transistor 506 is turned on to connect this signal path to ground. Alternatively, the controller will output logical values of 0 and 1 for x and $\overline{x}$ when $\overline{V}_{out}$ is connected to drive the load.

Once generated, $V_{out}$ (or $\overline{V}_{out}$) may higher than the minimum operating voltage of the load. In this case, $V_{out}$ may be regulated or adjusted to coincide with this minimum operating voltage. (Block 513). Because the capacitor voltage continues to wane with use, $V_{out}$ and/or its complement $\overline{V}_{out}$ may be monitored by the controller throughout the time the adiabatic amplifier is connected. (Block 514). As the capacitor voltage ($V_{in}$) reduces, a voltage regulator circuit connected to the output of the amplifier may regulate $V_{out}$ and $\overline{V}_{out}$ to ensure that a relevant one of these voltages is maintained at the minimum load-driving voltage. (Block 515).

Throughout this time, the controller may compare the capacitor voltage to a second reference value, which equals or is based on a minimum operating voltage of the adiabatic amplifier. (Block 516). When the capacitor voltage falls below the minimum operating voltage of the adiabatic amplifier, the controller terminates the energy extraction process by disconnecting the amplifier from at least one of the load and capacitor. (Block 517).

In accordance with another embodiment of the present invention, the energy extraction circuit may be a DC-to-DC regulator circuit such as disclosed in U.S. patent application Ser. No. 10/330,555, which uses independently switched inductors to perform voltage conversion and U.S. Pat. No. 7,202,648.

Figure 23:
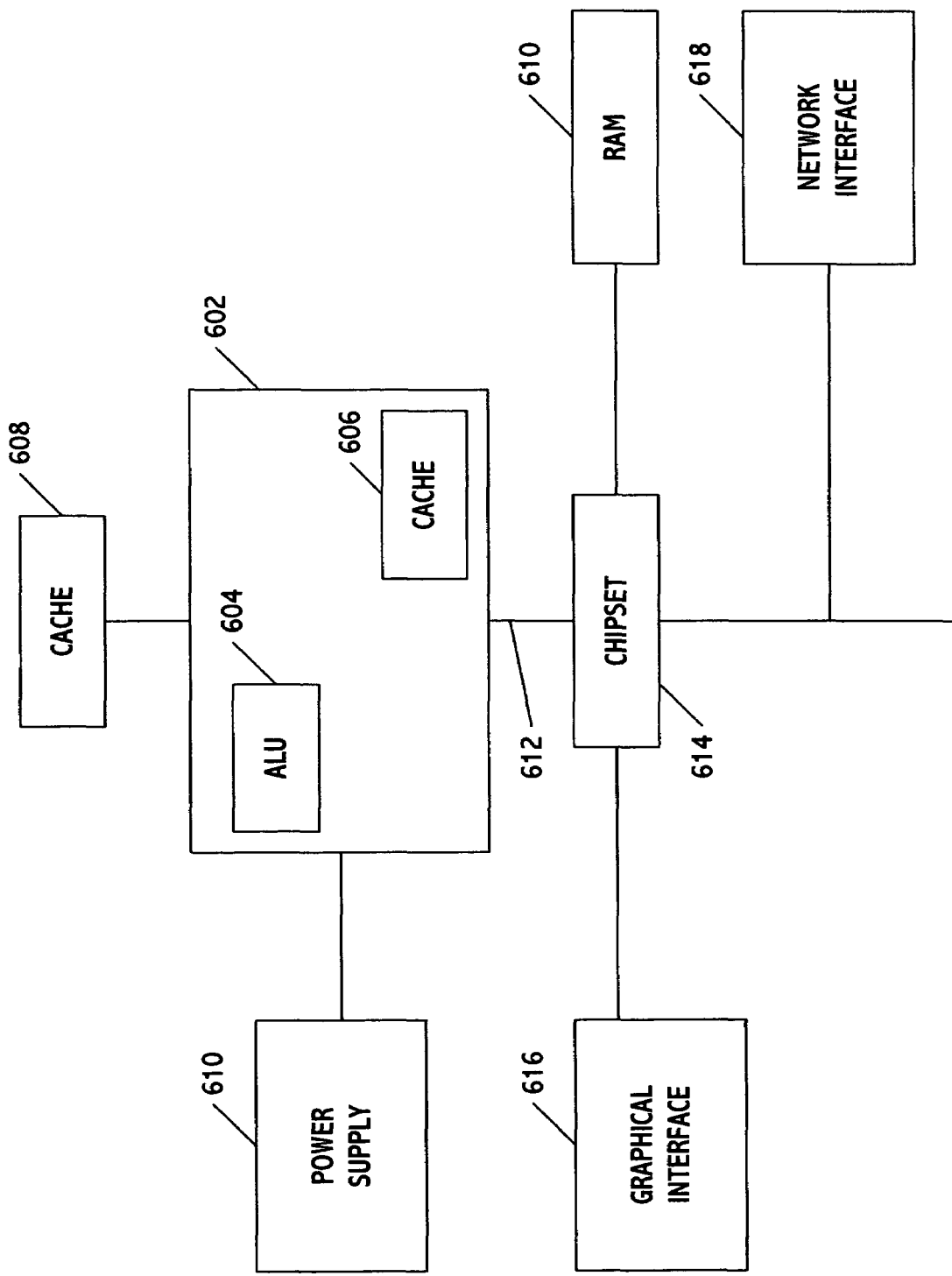
FIG. 23 is a diagram showing a processing system which includes one or more of the embodiments of the energy extraction circuit of the present invention, which circuit may be used to extract energy from an ultracapacitor as described herein or another type of capacitive circuit.

FIG. 23 is a diagram showing a processing system which includes a processor 610, a power supply 620, and a memory 630 which, for example, may be a random-access memory. The processor includes an arithmetic logic unit 612 and an internal cache 614. The system also preferably includes a graphical interface 640, a chipset 650, a cache 660, and a network interface 670. The processor may be a microprocessor or any other type of processor. If the processor is a microprocessor, it may be included on a chip die with all or any combination of the remaining features, or one or more of the remaining features may be electrically coupled to the microprocessor die through known connections and interfaces.

If the power supply is or includes a capacitor (e.g., an ultracapacitor as described herein), any one of the embodiments of the energy extraction circuit of the present invention may be used to extract energy from the capacitor when the voltage in the capacitor falls below a load-driving voltage. The ultracapacitor may be included on the same chip with or may be integrated into any feature in FIG. 23, including ones formed by or supported in silicon or which is isolated by an insulating material, e.g., silicon dioxide.

The energy extraction circuit may be included in the power supply circuit or may be externally connected, e.g., in the processor. Alternatively, the energy extraction circuit may be used to extract energy from a capacitor used in any part of the system shown in FIG. 23, especially when that capacitor is an ultracapacitor as described herein. In one or more of the foregoing embodiments, CMOS elements may be replaced with an arrangement of switches, bipolar transistors, and diodes and vice versa.

Other modifications and variations to the embodiments of the invention will be apparent to those skilled in the art from the foregoing disclosure. Thus, while only certain embodiments have been specifically described herein, it will be apparent that numerous modifications may be made thereto without departing from the spirit and scope of the invention.

We claim:

1. A system, comprising:
    a detector to detect a voltage stored in an ultracapacitor coupled to a load; and
    an extractor to extract energy from the ultracapacitor, the extractor including:
    a first amplifier circuit to amplify an output voltage from the ultracapacitor when the detected voltage falls below a first predetermined voltage;
    a divider to divide the amplified voltage to form a first control signal for the first amplifier circuit; and
    a controller to generate a second control signal to vary a ratio of the divider, the varied ratio adjusting the first control signal to maintain the output voltage of the ultracapacitor substantially equal to or above the first predetermined voltage, the first amplifier circuit to amplify the output voltage independent of coupling the ultracapacitor to a DC power source during a charging operation of the ultracapacitor and during a time when the load is to be driven based on the amplified output voltage, and wherein an operation is to be performed to prevent the first amplifier circuit from amplifying the output voltage of the ultracapacitor when the detected voltage is above the first predetermined voltage.

2. The system of claim 1, wherein the first amplifier circuit is to amplify said output voltage of the ultracapacitor to a level substantially equal to or above the first predetermined voltage during a time when the detected voltage of the ultracapacitor is above a second predetermined voltage of the first amplifier circuit.

3. The system of claim 1, further comprising:
a second amplifier circuit to adjust impedance of the amplified voltage output from the first amplifier circuit.

4. A system, comprising:
a detector to detect a voltage stored in an ultracapacitor coupled to a load; and
an extractor to extract energy from the ultracapacitor, the extractor including:
an adiabatic amplifier to amplify voltage output from the ultracapacitor when the detected voltage falls below a first predetermined voltage, wherein the adiabatic amplifier includes:
first and second transmission gates that are alternatively switched to output an amplified differential signal that corresponds to the amplified voltage of the ultracapacitor, wherein the adiabatic amplifier is to amplify the voltage output from the ultracapacitor independent of coupling the ultracapacitor to a DC power source during a charging operation of the ultracapacitor and during a time when the load is to be driven based on the amplified output voltage, and wherein an operation is to be performed to prevent the adiabatic amplifier from amplifying the output voltage of the ultracapacitor when the detected voltage is above the first predetermined voltage.

5. The system of claim 4, further comprising:
a controller to monitor a change in the amplified voltage; and
a voltage regulator to adjust the amplified differential signal to cause the amplified voltage of the ultracapacitor to be substantially equal to or above the first predetermined voltage.

6. The system of claim 1, wherein the extractor is a DC-to-DC boost converter.

7. A method, comprising:
detecting a voltage stored in an ultracapacitor coupled to a load; and
extracting energy from the ultracapacitor when the voltage falls below a predetermined value, said extracting including:
amplifying an output voltage from the ultracapacitor using a first amplifier circuit, the output voltage amplified when the detected voltage falls below a first predetermined voltage;
dividing the amplified voltage using a divider to form a first control signal for the first amplifier circuit; and
generating a second control signal to vary a ratio of the divider, the varied ratio adjusting the first control signal to maintain the output voltage of the ultracapacitor substantially equal to or above the first predetermined voltage, the first amplifier circuit to amplify said output voltage independent of coupling the ultracapacitor to a DC power source during a charging operation of the ultracapacitor and during a time when the load is to be driven based on the amplified output voltage, said method further comprising:
performing an operation to prevent the first amplifier circuit from amplifying the output voltage of the ultracapacitor when the detected voltage is above the first predetermined voltage.

8. The method of claim 7, wherein the varied ratio adjusts the first control signal to maintain the output voltage of the ultracapacitor substantially equal to or above the first predetermined voltage during a time when the detected voltage of the ultracapacitor is above a second predetermined voltage of an amplifier circuit that is to perform said amplifying.

9. The method of claim 8, further comprising:
detecting a reduction in the increased voltage over time; and
adjusting the reduced voltage to maintain at least the predetermined voltage of the load.

10. The method of claim 7, wherein said amplifying is performed by a circuit which includes an adiabatic amplifier.

11. A system, comprising:
a load;
an ultracapacitor storing a voltage to drive the load; and
an extractor to extract energy from the ultracapacitor, the extractor including:
a first amplifier circuit to amplify an output voltage from the ultracapacitor when the detected voltage falls below a first predetermined voltage,
a divider to divide the amplified voltage to form a first control signal for the first amplifier circuit; and
a controller to generate a second control signal to vary a ratio of the divider, the varied ratio adjusting the first control signal to maintain the output voltage of the ultracapacitor substantially equal to or above the first predetermined voltage, the first amplifier circuit to amplify said output voltage independent of coupling the ultracapacitor to a DC power source during a charging operation of the ultracapacitor and during a time when the load is to be driven based on the amplified output voltage, and wherein an operation is to be performed to prevent the first amplifier circuit from amplifying the output voltage of the ultracapacitor when the detected voltage is above the first predetermined voltage.

12. The system of claim 11, wherein the load is at least one of a power supply, processor, cache, chipset, and a memory.

13. The system of claim 11, wherein the load, ultracapacitor, and extractor are included on a single die.

14. The system of claim 2, wherein the first predetermined voltage corresponds to a minimum operating voltage of the load.

15. The system of claim 14, wherein the second predetermined voltage corresponds to a minimum operating voltage of the first amplifier circuit.

16. The system of claim 15, wherein the extractor is disabled when a voltage of the voltage source falls below a second predetermined voltage of the extractor.

17. The system of claim 16, wherein the first predetermined voltage corresponds to a minimum operating voltage of the load.

18. The system of claim 17, wherein the second predetermined voltage corresponds to a minimum operating voltage of the extractor.

19. The system of claim 2, wherein the extractor is disabled when the detected voltage of the ultracapacitor falls below the second predetermined voltage of the first amplifier circuit.

20. The system of claim 1, wherein the ultracapacitor is to be coupled to the load along a first signal path when the detected voltage is above the first predetermined voltage and wherein the ultracapacitor is to be coupled to the load along a second signal path passing through the extractor and disconnected from the first signal path when the detected voltage is below the first predetermined voltage.

21. The system of claim 1, wherein the divider includes a network of variable resistors.

22. The system of claim 21, wherein the second control signal is to vary values of the variable resistors to change amplification of the first amplifier circuit, the changed amplification causing the output voltage of the ultracapacitor to be substantially equal to or above the first predetermined voltage of the load.

23. The system of claim 1, wherein the ratio of the divider is continuously changed by the controller as the detected voltage of the ultracapacitor changes over time.

* * * * *